US012364142B2

(12) United States Patent
Ma et al.

(10) Patent No.: US 12,364,142 B2
(45) Date of Patent: Jul. 15, 2025

(54) DISPLAY PANEL AND DISPLAY DEVICE

(71) Applicant: Wuhan Tianma Micro-Electronics Co., Ltd., Wuhan (CN)

(72) Inventors: Yangzhao Ma, Wuhan (CN); Hao Dai, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 407 days.

(21) Appl. No.: 18/110,897

(22) Filed: Feb. 17, 2023

(65) Prior Publication Data

US 2024/0099098 A1 Mar. 21, 2024

(30) Foreign Application Priority Data

Sep. 21, 2022 (CN) .......................... 202211151375.9

(51) Int. Cl.
*H10K 59/65* (2023.01)
*H10K 59/131* (2023.01)

(52) U.S. Cl.
CPC .......... *H10K 59/65* (2023.02); *H10K 59/131* (2023.02)

(58) Field of Classification Search
None
See application file for complete search history.

(56) References Cited

U.S. PATENT DOCUMENTS

| 10,699,621 | B2* | 6/2020 | Ma | G09G 3/035 |
| 2007/0216613 | A1* | 9/2007 | Ogura | G09G 3/3233 345/76 |
| 2013/0307761 | A1* | 11/2013 | Kwak | G02F 1/13452 315/297 |
| 2018/0315387 | A1* | 11/2018 | Park | G09G 3/3674 |
| 2019/0109184 | A1* | 4/2019 | Li | G06F 1/163 |
| 2020/0105201 | A1* | 4/2020 | Li | G09G 3/3685 |
| 2021/0028227 | A1* | 1/2021 | Yue | H10H 20/855 |
| 2021/0091147 | A1* | 3/2021 | Liu | H10K 59/80517 |

* cited by examiner

*Primary Examiner* — Bilkis Jahan
(74) *Attorney, Agent, or Firm* — Anova Law Group, PLLC

(57) ABSTRACT

A display panel and a display device are provided. The display panel includes a first display region, a first optical component region, and a second optical component region. The first optical component region and the second optical component region are arranged along a first direction. The first display region at least partially surrounds the first optical component region and the second optical component region. The first display region includes first signal lines extending along the first direction. Each of some first signal lines includes a first line segment and a second line segment. The first line segment and the second line segment are electrically connected through a first connection line; and at least a portion of line segments of the first connection line is arranged in layers different from the first line segment and the second line segment.

18 Claims, 20 Drawing Sheets

DISPLAY PANEL AND DISPLAY DEVICE

CROSS-REFERENCE TO RELATED APPLICATION

This application claims the priority of Chinese Patent Application No. 202211151375.9, filed on Sep. 21, 2022, the content of which is incorporated herein by reference in its entirety.

TECHNICAL FIELD

The present disclosure generally relates to the field of display technologies and, more particularly, relates to a display panel and a display device.

BACKGROUND

From the cathode ray tube (CRT) era to the liquid crystal display (LCD) era, and to the emerging organic light-emitting diode (OLED) and light-emitting diode display era, the display industry has evolved significantly after decades of development. For display devices from conventional mobile phones, tablets, TVs and PCs to current smart wearable devices, VR, vehicle displays and other electronic devices, display technology is inseparable.

To meet photosensitive requirements of display products such as when taking pictures, an optical component region (a through hole, a blind hole or an under-screen camera) is usually introduced into a display product to accommodate a photosensitive component such as a camera. However, with the introduction of the optical component region, wirings originally set in the display product will be disconnected by the optical component region. In existing technologies, the connection of the disconnected wirings is usually realized by wiring surrounding the optical component region. However, a width of a non-display region around the optical component region is increased, which is not beneficial to the design of a narrow frame around the optical component region, resulting in a decrease in the screen ratio of the display product.

SUMMARY

One aspect of the present disclosure provides a display panel. The display panel includes a first display region, a first optical component region and a second optical component region. The first optical component region and the second optical component region are arranged along a first direction. The first display region at least partially surrounds the first optical component region and the second optical component region. The first display region includes a plurality of first signal lines extending along the first direction. Each of some of the plurality of first signal lines includes a first line segment and a second line segment. The first line segment is located between the first optical component region and the second optical component region. The second line segment is located on a side of the first optical component region away from the second optic zone and/or a side of the second optical component region away from the first optical component region. The first line segment and the second line segment are electrically connected through a first connection line; and at least a portion of line segments of the first connection line is arranged in layers different from the first line segment and the second line segment.

Another aspect of the present disclosure provides a display device. The display device includes a display panel. The display panel includes a first display region, a first optical component region and a second optical component region. The first optical component region and the second optical component region are arranged along a first direction. The first display region at least partially surrounds the first optical component region and the second optical component region. The first display region includes a plurality of first signal lines extending along the first direction. Each of some of the plurality of first signal lines includes a first line segment and a second line segment. The first line segment is located between the first optical component region and the second optical component region. The second line segment is located on a side of the first optical component region away from the second optic zone and/or a side of the second optical component region away from the first optical component region. The first line segment and the second line segment are electrically connected through a first connection line; and at least a portion of line segments of the first connection line is arranged in layers different from the first line segment and the second line segment.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
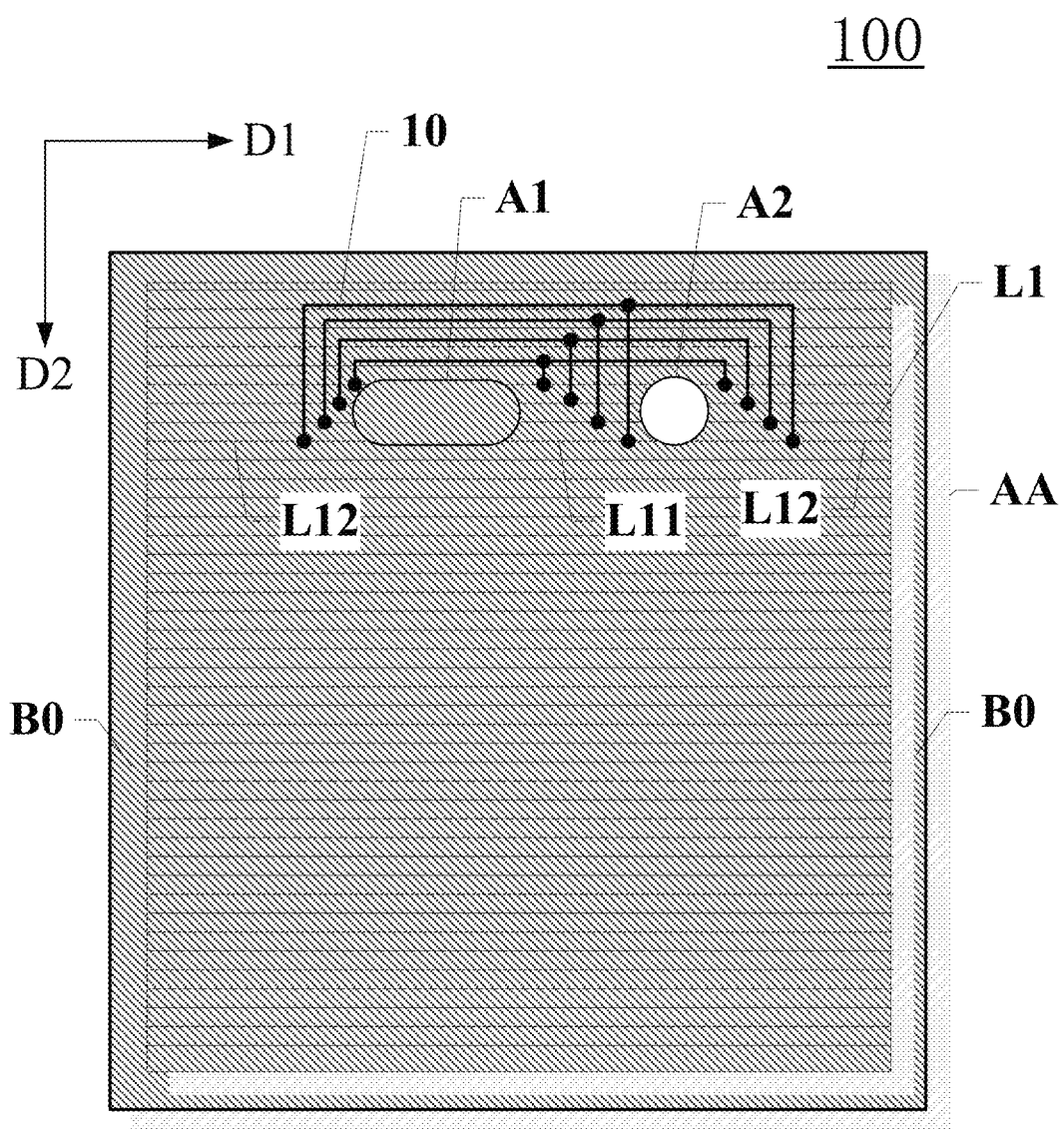
FIG. 1 illustrates an exemplary structure of a display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

When a optical component region for accommodating photosensitive elements such as cameras is introduced into a display panel, signal lines originally arranged in the optical component region need to be routed around the optical component region. When the number of the routed signal lines is large, a width of a frame around the optical component region may be larger, which is not beneficial to realizing a narrow frame design around the optical component region and results in a reduction in the screen-to-body ratio of the display product.

The present disclosure provides a display panel. The display panel may include a first display region, a first optical component region and a second optical component region. The first optical component region and the second optical component region may be arranged along a first direction. The first display region may at least partially surround the first optical component region and the second optical component region.

The first display region may include a plurality of first signal lines extending along the first direction. Each of at least some of the plurality of first signal lines may include a first line segment and a second line segment. The first line segment may be located between the first optical component region and the second optical component region, and the second line segment may be located at a side of the first optical component region away from the second optical component region and/or a side of the second optical component region away from the first optical component region. The first line segment and the second line segment may be electrically connected through a first connection line, and at least a part of line segments of the first connection line may be arranged in different layers with the first line segment and the second line segment. The electrical connection between the first line segments and the second line segments in some of the plurality of first signal line may be realized by introducing the first connection segments. Since at least a part of the line segments in the first connection segments may be arranged in different layers from the first line segments and the second line segments, lines routed around the first optical component region and the second optical component region may be avoided, thereby providing a compressible space for the frame region corresponding to the first optical component region and the second optical component region. The frame region corresponding to the first optical component and the second optical component region may be narrowed, to increase the screen-to-body ratio of the display panel and the display device.

Reference will now be made in detail to exemplary embodiments of the disclosure, which are illustrated in the accompanying drawings. Hereinafter, embodiments consistent with the disclosure will be described with reference to drawings. The disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 2:
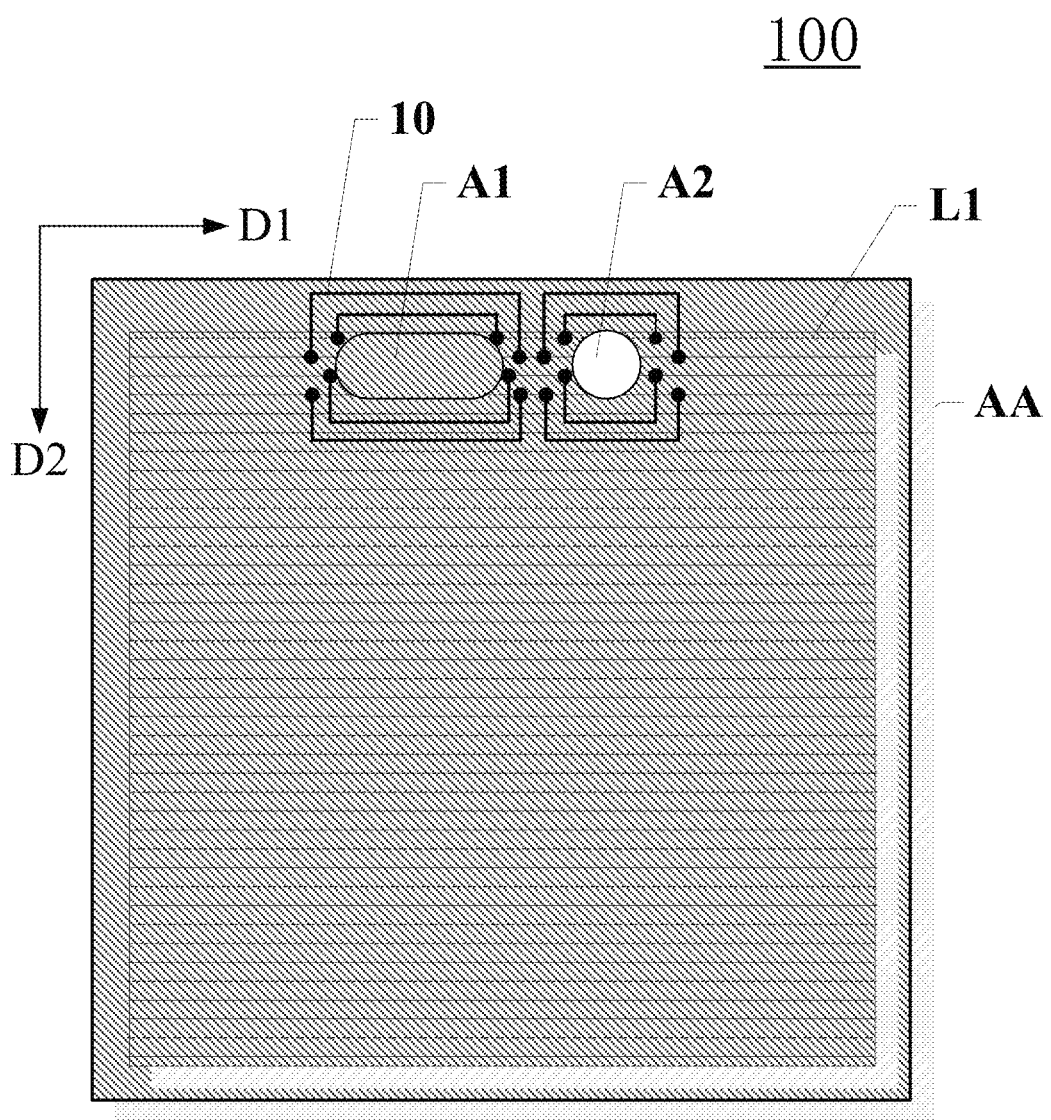
FIG. 2 illustrates another exemplary structure of a display panel consistent with various disclosed embodiments of the present disclosure.
Figure 3:
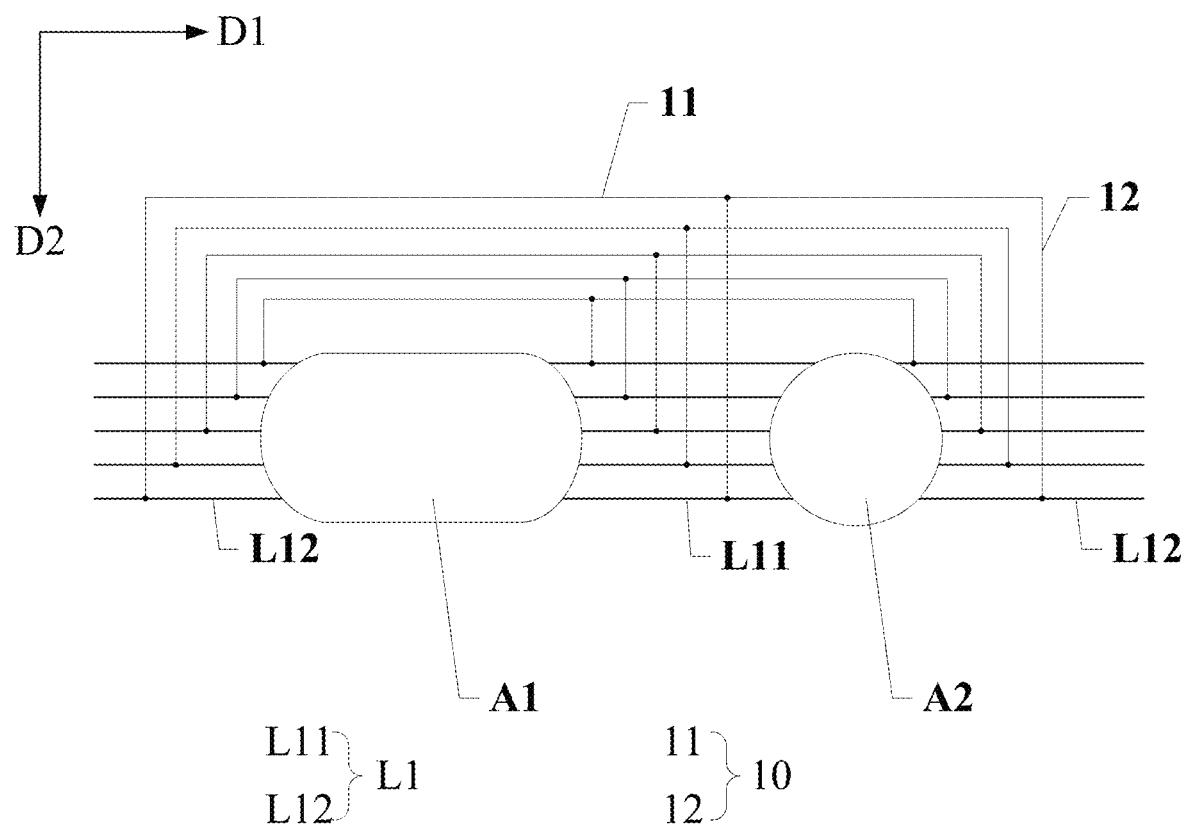
FIG. 3 illustrates an exemplary wiring schematic diagram of first signal lines around a first optical component region and a second optical component region, consistent with various disclosed embodiments of the present disclosure.

FIG. 1 illustrates an exemplary display panel according to one embodiment of the present disclosure, FIG. 2 illustrates another exemplary display panel according to one embodiment of the present disclosure, and FIG. 3 illustrates an exemplary wiring schematic diagram of first signal lines around the first optical component region and the second optical component region. In FIG. 1, the first display region AA may completely surround the first optical component region A1 and the second optical component region A. In FIG. 2, the first display region AA may semi-surround the first optical component region A1 and the second optical component region A.

As shown in FIG. 1 to FIG. 3, one embodiment of the present disclosure provides a display panel 100. The display panel 100 may include a first display region AA, a first optical component region A1, and a second optical component region A2. The first optical component region A1 and the second optical component region A2 may be arranged along a first direction D1. The first display region AA may at least partially surround the first optical component region A1 and the second optical component region A2.

The first display region AA may include a plurality of first signal lines L1 extending along the first direction D1. Each of at least a portion of the plurality of first signal lines L1 may include a first line segment L11 and a second line segment L12. The first line segment L11 may be located between the first optical component region A1 and the second optical component region A2, and the second line segment L12 may be located at a side of the first optical component region A1 away from the second optical component region A2 and/or a side of the second optical component region A2 away from the first optical component region A1. One first line segment L11 may be electrically connected to one corresponding second line segment L12 through a corresponding first connection line. At least a portion of the line segments in the first connection line L1 may be arranged in different layers from the first line segment L11 and the second line segment L12.

Optionally, in some embodiments, when the display panel is applied in a display device, the first optical component region A1 and the second optical component region A2 may be used to accommodate optical devices including cameras. When photographing images, the optical component regions may transmit light. In some embodiments of the present disclosure, the structure of the display panel in the first optical component region A1 and the second optical component region A2 may be one of non-display through holes, non-display blind holes or displayable virtual holes (camera structures under the display screen) respectively.

In the present disclosure, the display panel 100 may include the first optical component region A1 and the second optical component region A2 arranged along the first direction D1. The first display region AA may at least partially surround the first optical component region A1 and the second optical component region A2. For example, the first display region AA may fully surround the first optical component region A1 and the second optical component region A2 in the structure shown in FIG. 1. In another example, as shown in FIG. 2, the first display region AA may semi-surround the first optical component region A1 and the second optical component region A2. The first display region AA may include the plurality of first signal lines L1 extending along the first direction D1. Along the first direction D1, a portion of the plurality of first signal lines L1 may overlap the first optical component region A1 and the second optical component region A2. One first line segment L11 of the portion of the plurality of the first signal lines L1 may include a first line segment L11 and at least one second line segment L12. The first line segment L11 may be located between the first optical component region A1 and the second optical component region A2, and at least a portion of the at least one second line segment L12 may be located on the side of the first optical component region A1 away from the second optical component region A2, and/or, at least a portion of the at least one of the second line segment L12 may be located on the side of the second optical component region A2 away from the first optical component region A1. In the present embodiment, the first signal line L1 including two second line segments L12 disposed respectively on two sides of the first line segment L11 is used as an example to illustrate the present disclosure. To realize the electrical connection between the first line segment L11 and the at least one second line segment L12 in the first signal line L1, a first connection line 10 may be disposed in the display panel, and line segments of the first connection line 10 may be at least partially disposed in layers different from the first line segment L11 and the at least one second line segment L12 of the first signal line L1. Using the first connection line 10 to electrically connect the first line segment L11 and the at least one second line segment L12 of the first signal line L1, may make wiring in a frame region around the first optical component region A1 or the second optical component region A2 unnecessary. Therefore, the number of lines corresponding to the frame region around the first optical component region A1 and the second optical component region A2 may be reduced, to provide a compressible space for the frame region of the first optical component region A1 and the second optical component region A2. The narrow frame design around the optical component regions corresponding to the first optical component region A1 and the second optical component region A2 may be realized, improving the screen-to-body ratio of the display panel.

The display panel in FIG. 1 and FIG. 2 is used as an example only to illustrate the present disclosure, and does not limit the scope of the present disclosure. In some embodiments, the structure of the display panel may not be limited to the structure in FIG. 1 and FIG. 2, but may also include other structures, such as film layer structures, pixel circuits, or driving circuits of the display panel. The details may be made reference to structures of display panels in existing technologies. The embodiment shown in FIG. 1 and FIG. 2 where the shape of the display panel is a rectangle is used as an example only to illustrate the present disclosure, and does not limit the scope of the present disclosure. In some other embodiments, the shape of the display panel may be other suitable shapes such as a rounded rectangle, a circle, or an oval. In this embodiment, the number of first signal lines L1 overlapping with the first optical component region A1 and the second optical component region A2 along the first direction D1 is only used as an example for illustration, and does not represent the actual number. Further, the embodiment shown in FIG. 1 where the display panel includes two optical component regions is used as an example only to illustrate the present disclosure, and does not limit the scope of the present disclosure. In some other embodiments, the number of optical component regions in the display panel may be three or more, which is not limited in the present disclosure.

Figure 4:
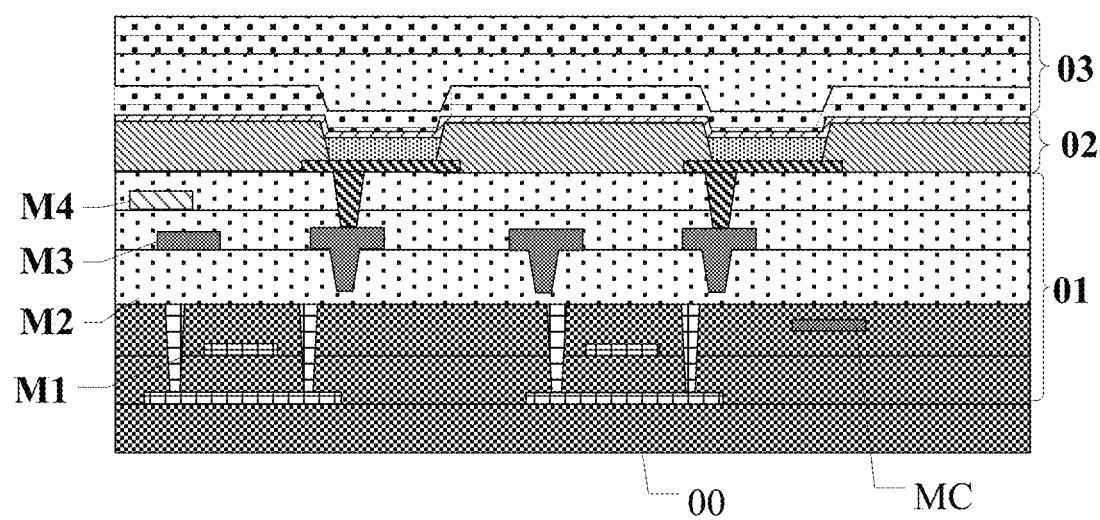
FIG. 4 illustrates an exemplary film layer structure of a display panel, consistent with various disclosed embodiments of the present disclosure.

FIG. 4 is a schematic diagram of a film layer structure of the display panel. In one embodiment shown in FIG. 4, the display panel may include a substrate 00, a first metal layer M1 disposed on the substrate 00, a capacitor metal layer MC, a second metal layer M2, a third metal layer M3, a fourth metal layer M4, etc. Adjacent metal layers may be separated by corresponding insulating layers. Optionally, along the thickness direction of the display panel, the capacitive metal layer MC may be located between the first metal layer M1 and the second metal layer M2, the third metal layer M3 may be located on a side of the second metal layer M2 facing light-emitting elements, and the fourth metal layer M4 may be located on a side of the third metal layer M3 facing the light-emitting elements. When the display panel includes transistors, optionally, gates of the transistors may be located on the first metal layer M1, and sources and drains of the transistors may be located on the second metal layer M2. At least a portion of metal on the capacitor metal layer MC may be overlap with a portion of metal of the first metal layer M1 or the second metal layer M2 to form a capacitor structure, for example, to form storage capacitors of pixel circuits of the display panel. Further, the film layers of the first metal layer M1, the capacitor metal layer MC, the second metal layer M2, the third metal layer M3 and the fourth metal layer M4 may be used for wiring signal lines.

As shown in FIG. 1 to FIG. 4, the first signal line L1 may be located on the first metal layer M1 or the capacitive metal layer MC, and at least part of the line segments in the first connection line 10 may be located on the third metal layer M3 or the fourth metal layer M4. The actual film layer structure of the first signal line L1 and the first connection line 10 is not specifically limited, as long as the first signal line L1 and at least part of the line segments of the first connection line 10 are disposed in different layers in the actual film layer structure. The film layer structure of the display panel shown in FIG. 4 is only schematically for example to illustrate the present disclosure, and does not represent the relationship between the film layers actually included in the display panel, as well as the number and size of the film layers.

As shown in FIG. 4, in one embodiment, the display panel provided in this embodiment may be a display panel using organic light-emitting diode display technology, that is, an OLED (Organic Light-Emitting Diode) display panel. Optionally, the display panel may include a substrate 00, an array layer 01, a light-emitting layer 02 and a packaging layer 03. A basic structure of the light emitting layer 02 of the OLED display panel may generally include an anode, a light emitting material layer and a cathode. When a power supply supplies an appropriate voltage, holes in the anode and electrons in the cathode may combine in the light emitting material layer to produce bright light. Compared with thin film field effect transistor liquid crystal displays, OLED display devices have the characteristics of high visibility and high brightness, and are more power-saving, lighter in weight, and thinner in thickness. In some other embodiments of the present disclosure, the display panel may also be a display panel using an inorganic light emitting diode display technology, such as a Micro LED display panel, or a Mini LED display panel, and the like.

As shown in FIG. 3, in one embodiment, the first connection line 10 may include a first connection segment 11 and a second connection segment 12. The first connection segment 11 may extend along the first direction D1, and the second connection segment 11 may extend along a second direction D2. The first direction D1 may intersect the second direction D2. The first line segment L11 and the at least one second line segment L12 may electrically connected through the second connection segment 12 and the first connection segment 11.

Specifically, the embodiment shown in FIG. 3 shows that the first connection line 10 may be composed of two types of line segments, one of which is the first connection segment 11 extending along the first direction D1 and the other is the second connection segment 12 extending in the direction D2. Optionally, the second direction D2 may be perpendicular to the first direction D1. To control the normal display of the display panel, a plurality of signal lines extending along the first direction D1 and a plurality of signal lines extending along the second direction D2 are usually provided in the display panel. When introducing the first connection line 10 for connecting the first line segment L11 and the at least one second line segment L12 of the first signal line L1 in the present embodiment, the line segments included in the first connection line 10 may be also set to extend along the first direction D1 or along the second direction D2, to match extending directions of other lines in the display panel. Therefore, the width of the frame region corresponding to the optical component regions may be reduced and the wiring complexity of the first connection line 10 may be simplified.

As shown in FIG. 3, in another embodiment, the first connection line 10 may include a first connection segment 11 and at least two second connection segments 12 corresponding to the first connection segment 11. The first line segment L11 and the at least one second line segment L12 of the first signal line 10 may be electrically connected to the first connection segment 11 through different second connection segments 12.

Specifically, in the embodiment shown in FIG. 3, the first signal line 10 may include one first line segment L11 and two second line segments L12, and the first line segment L11 of the first signal line L1 may be electrically connected to the two second line segments L12 through the first connection line 10. In one embodiment, the first connection line 10 may include one first connection segment 11 and three second connection segments 12 connected to the first connection segment. In the first connection line 10, one end of the three second connection segments 12 may be respectively connected with one of the second line segments L12 located on the side of the first optical component region A1 away from the second optical component region A2, the first line segment L11 between the first optical component region A1 and the second optical component region A2, and one of the second line segments L12 located on the side of the second optical component region A2 away from the first optical component region A1. Another of the three second connection segments 12 may be connected to the same first connection segment 11. Therefore, it may be equivalent to connecting the first connection segment 11 and the first signal line L1 in parallel through the three second connection segments 12. Correspondingly, the signal transmission may be realized between the first line segment L11 and the second signal line segments L12 of the first signal line L1 connected by the first connection line 10, and also the overall impedance of the first signal line L1 may be reduced, avoiding the problem that the overall impedance of the first signal line L1 becomes larger after the introduction of the first connection line 10. The narrow design of the frame region corresponding to the optical component regions may be realized, and also reliable transmission of signals on the first signal line L1 may be ensured.

Figure 5:
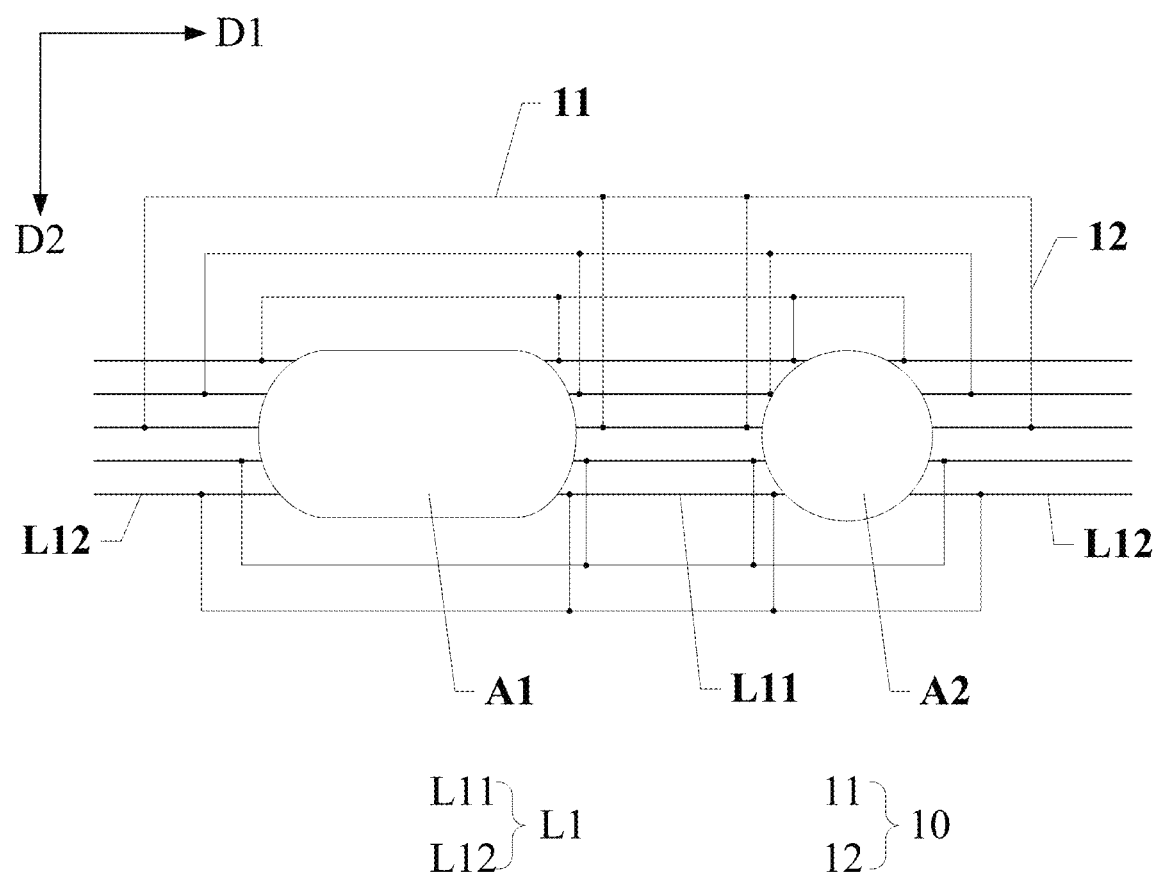
FIG. 5 illustrates another exemplary wiring schematic diagram of first signal lines around a first optical component region and a second optical component region, consistent with various disclosed embodiments of the present disclosure.

FIG. 5 is another schematic diagram of the wiring of the first signal line L1 arranged around the first optical component region A1 and the second optical component region A2. The difference from the embodiment shown in FIG. 3 is that this embodiment shows a scheme in which the same first line segment L11 is connected to the first connection segment 11 through two second connection segments 12.

As shown in FIG. 5, in one embodiment, the same first line segment L11 may be connected to the first connection segment 11 through at least two second connection segments 12.

Specifically, in this embodiment, the first line segment L11 located between the first optical component region A1 and the second optical component region A2 may be respectively connected to different second connection segments 12, and may be connected to the same first connection segment 11 through the different second connection segments 12. Therefore, the signal on the first connection segment 11 may be transmitted to the same first line segment L11 through two second connection segments 12, which is beneficial to ensure the accuracy and reliability of the signal received by the first connection segment L11 ensuring the normal display function between the first optical component region A1 and the second optical component region A2. Further, the way that the same first line segment L11 is connected to the same first connection segment 11 through at least two second connection segments 12 may also further reduce the overall impedance of the first signal line 10 and improve the accuracy and stability of signal transmission on the second line segments L12.

The embodiment in FIG. 5 where the same first line segment L11 is connected to the same first connection segment 11 through two second connection segments 12 is used as an example only to illustrate the present disclosure, and does no limit the number of the second connection segments 12 connected to the same first connection segment 11. In some other embodiments, the same first line segment L11 may be connected to the same first connection segment 11 through three or more second connection segments 12.

Figure 6:
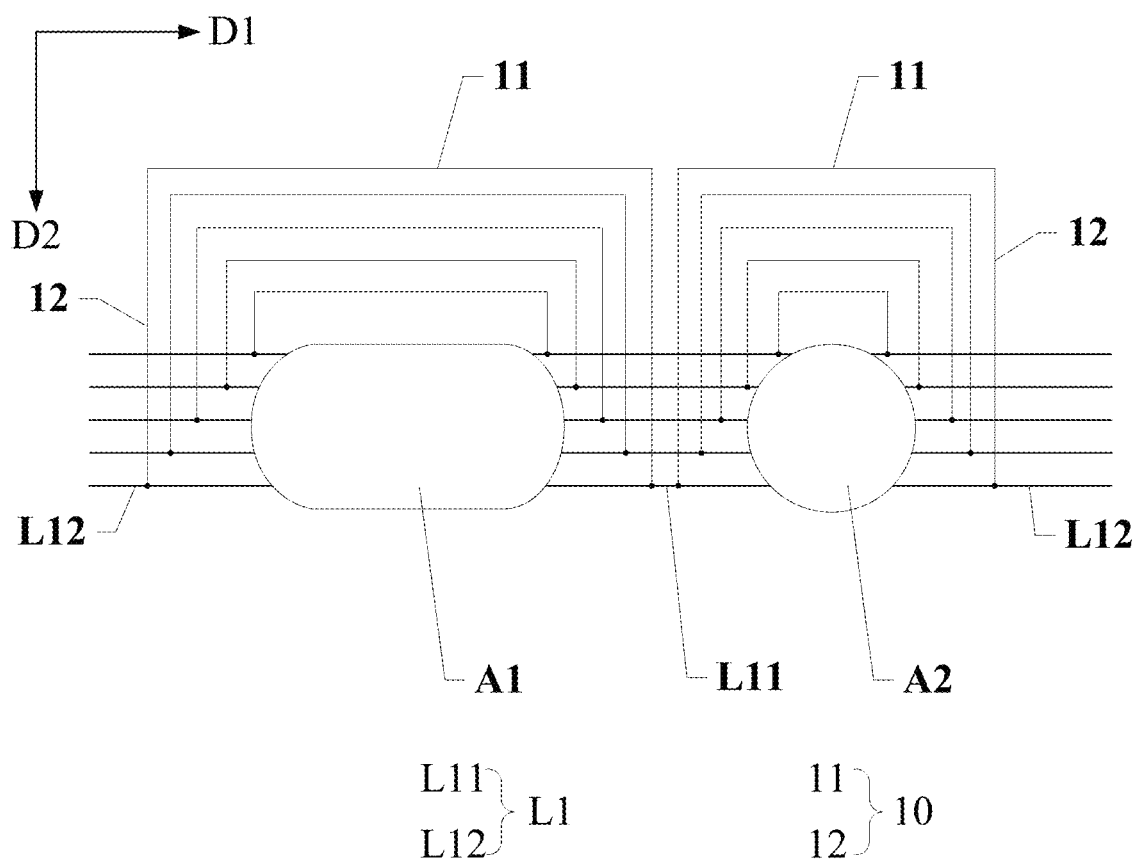
FIG. 6 illustrates another exemplary wiring schematic diagram of first signal lines around a first optical component region and a second optical component region, consistent with various disclosed embodiments of the present disclosure.

FIG. 6 is another schematic diagram of the wiring of the first signal line L1 arranged around the first optical component region A1 and the second optical component region A2. The difference from the embodiments shown in FIG. 3 and FIG. 5 is that this embodiment shows a scheme in which the same first connection line 10 may include two or more first connection segments 11.

As shown in FIG. 6, in one embodiment, the same first connection line 10 may include a plurality of first connection segments 11 and a plurality of second connection segments 12. The same first line segment L11 may be connected to first ends of different first connection segments 11 of the plurality of first connection segments 11 through different second connection segments 12 of the plurality of second connection segments 12. Second ends of the different first connection segments 11 may be connected to the different second line segments L12.

Specifically, the embodiment in FIG. 6 shows the solution that the number of first connection segments 11 included in the same first connection line 10 is the same as the number of optical component regions. That is, when the first optical component region A1 and the second optical component region A2 are provided, the same first connection line 10 may include two first connection segments 11. And optionally, the two first connection segments 11 corresponding to the same first connection line 10 may be respectively located on a same side of the first optical component region A1 and the second optical component region A2 along the second direction D2. In this embodiment, the first line segment L11 may be respectively connected to different first connection segments 11 through two different second connection segments 12. For example, an end of the first line segment L11 close to the first optical component region A1 may be electrically connected to one first connection segment 11 located on the upper or lower side of the first optical component region A1, and the first connection segment 11 may be also electrically connected to the second line segment L12 on the left side of the first optical component region A1 through another second connection segment 12. Another end of the first line segment L11 close to the second optical component region A2 may be electrically connected to one first connection segment 11 located on the upper side or lower side of the second optical component region A2, and the first connection segment 11 may be also electrically connected to the second line segment L12 on the right side of the second optical component region A2 through another second connection segment 12. Thus, the second line segment L12 on the left side of the first optical component region A1, the first line segment L11 between the first optical component region A1 and the second optical component region A2, the second line segment on the right side of the second optical component region A2 may be connected in series through the first connection segments 11 and the second connection segments 12 in the first connection line 10, realizing the signal transmission on the first line segment L11 and the second line segment L12 in the first signal line L1.

The foregoing embodiments show the scheme of arranging first connection segments 11 of first connection lines 10 on the same side of the first optical component region A1 and the second optical component region A2 along the second direction D2. At this time, the first connection segments 11 corresponding to each first connection line 10 may be arranged above the first optical component region A1 and the second optical component region A2, or the first connection segments 11 corresponding to each first connection line 10 may be arranged below the first optical component region A1 and the second optical component region A2, which is not specifically limited in the present disclosure.

In some other embodiments, the first connection segments 11 corresponding to the first connection lines 10 may also be arranged above and below the first optical component region A1 and the second optical component region A2. For example, in one embodiment shown in FIG. 5 to FIG. 7 which shows another schematic diagram of the wiring of the first signal line L1 arranged around the first optical component region A1 and the second optical component region A2, a portion of the first connection segment 11 may be located on a first side of the first optical component region A1 and the second optical component region A2 along the second direction D2, and another portion of the first connection segment 11 may be located on a second side of the first optical component region A1 and the second optical component region A2 along the second direction D2, and the first side may be opposite to the second side.

Figure 7:
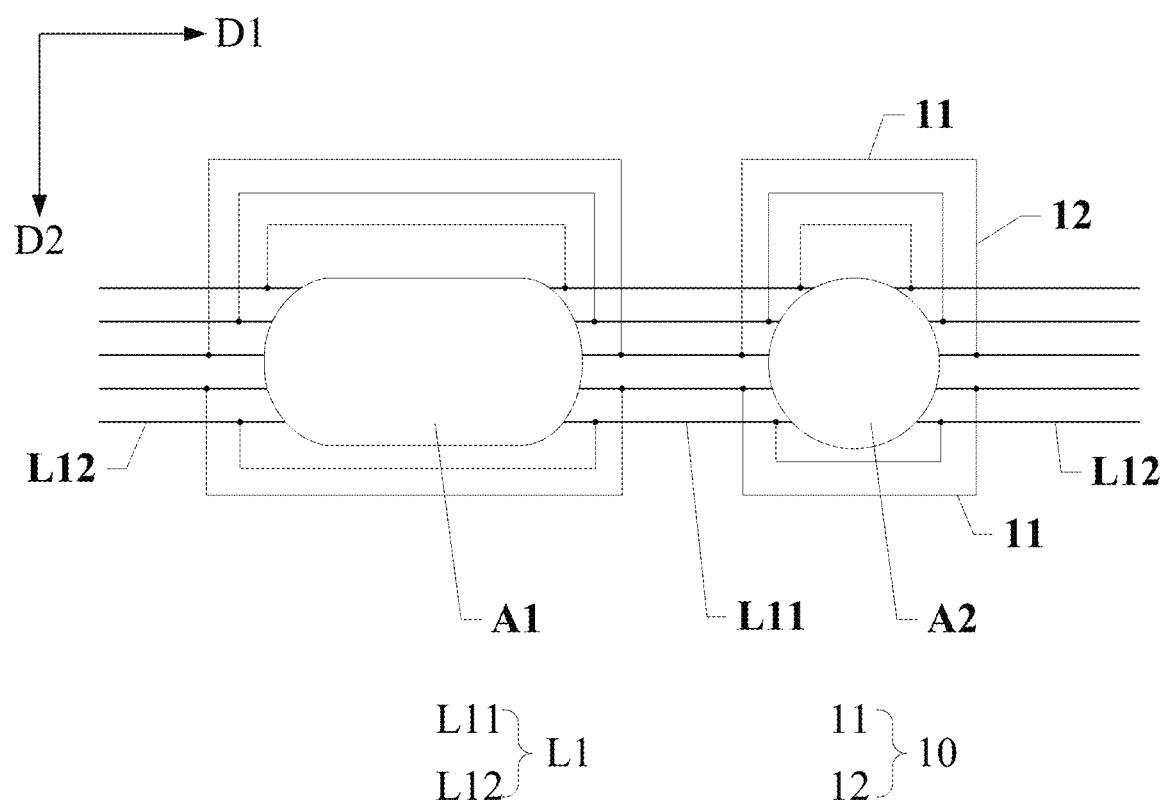
FIG. 7 illustrates another exemplary wiring schematic diagram of first signal lines around a first optical component region and a second optical component region, consistent with various disclosed embodiments of the present disclosure.

As shown in FIG. 5 and FIG. 7, in another embodiment, a portion of the first connection segments 11 may be located on a first side of the first optical component region A1 and the second optical component region A2 along the second direction D2, and another portion of the first connection segments 11 may be located on a second side of the first optical component region A1 and the second optical component region A2 along the second direction D2, where the first side may be opposite to the second side.

Specifically, when the first connection line 10 is introduced into the display panel to realize the electrical connection between the first line segment L11 and the second line segment L12 in the first signal line L1, in this embodiment, the first connection lines 11 of the first connection line 10 extending along the first direction D1 may be respectively arranged on two sides of the first optical component region A1 and the second optical component region A2 along the second direction D2, such that the first connection lines 10 may be arranged as evenly as possible on the upper and lower sides of the first optical component region A1 and the second optical component region A2. For example, on a same side of the first optical component region A1 or the second optical component region A2, a distance between two adjacent first connection segments 11 may be equal. Therefore, on the one hand, the surrounding space of the first optical component region A1 and the second optical component region A2 may be rationally utilized, and on the other hand, it may be also beneficial to alleviate the screen-off mura phenomenon caused by uneven distribution of the first connection lines 10 on the upper and lower sides of the first optical component region A1 and the second optical component region A2.

In one embodiment, the number of the first connection routing segments 11 located on two sides of the first optical component region A1 along the second direction D2 may be the same or approximately the same, and the number of first connection segments 11 located on two sides of the second optical component region A2 along the second direction D2 may be the same or approximately the same. The distance between two adjacent first connection segments 11 may be the same, to further improve the wiring uniformity of the first connection lines 10.

It should be noted that when one first signal line L1 overlaps the first optical component region A1 or the second optical component region A2 along the first direction D1, the length of the first signal line L1 may be different from conventional first signal lines L1, resulting in different impedance. At this time, the impedance difference between different first signal lines may be balanced by the length of the first connection line connecting the first line segment and the second line segment. Among the plurality of first signal lines overlapping with the first optical component region or the second optical component region along the first direction, when the lengths of the first optical component region or the second optical component region along the first direction are different, the missing lengths of the plurality of first signal lines may be different. At this time, the difference in impedance between the plurality of first signal lines may also be balanced by designing the lengths of the first connection lines corresponding to different first signal lines in a differentiated manner. Among the plurality of first signal lines overlapping with the first optical component region or the second optical component region along the first direction, when a portion of the plurality of first signal lines have the same missing length, since the lengths of the first connection lines corresponding to different first signal lines may be different, to balance the impedance difference between the plurality of first signal lines, the cross-sectional regions of the first connection lines with different lengths may be changed. For example, the cross-sectional region of one first connection line with a longer length may be set to be smaller than the cross-sectional region of one other first connection line with a shorter length. Or, at least part of the line segments in the first connection lines that are closer to the first optical component region and the second optical component region may be configured to be broken lines or curved lines, and line segments in the first connection lines that are far away from the first optical component region and the second optical component region may be set as straight lines, to make the lengths of different first connection lines close or same. Therefore, the impedance difference between the different first connection lines may be balanced.

As shown in FIG. 3 to FIG. 7, in one embodiment, the first connection segments 11 corresponding to different first signal lines L1 may be arranged on the same layer, the second connection segments 12 may be arranged on the same layer, and the first connection line sections 11 and the second connection line sections 12 may be arranged on different layers.

Specifically, this embodiment is equivalent to arranging the first connection segments 11 of the first connection lines 10 extending along the first direction D1 on the same film layer, and setting the second connection segments 12 extending along the second direction D2 on another film layer. When the first connection segments 11 and the second connection segments 12 are arranged in different layers, although the extending directions of the first connection segments 11 and the second connection segments 12 are different, their arrangement may not interfere with each other. When they need to be electrically connected, the electrical connection may be realized by punching holes. This design method may be beneficial to simplify the wiring difficulty of the first connection segments 11 and the second connection segments 12 in the first connection lines 10, and improve the routing efficiency of the first connection lines 10.

Figure 8:
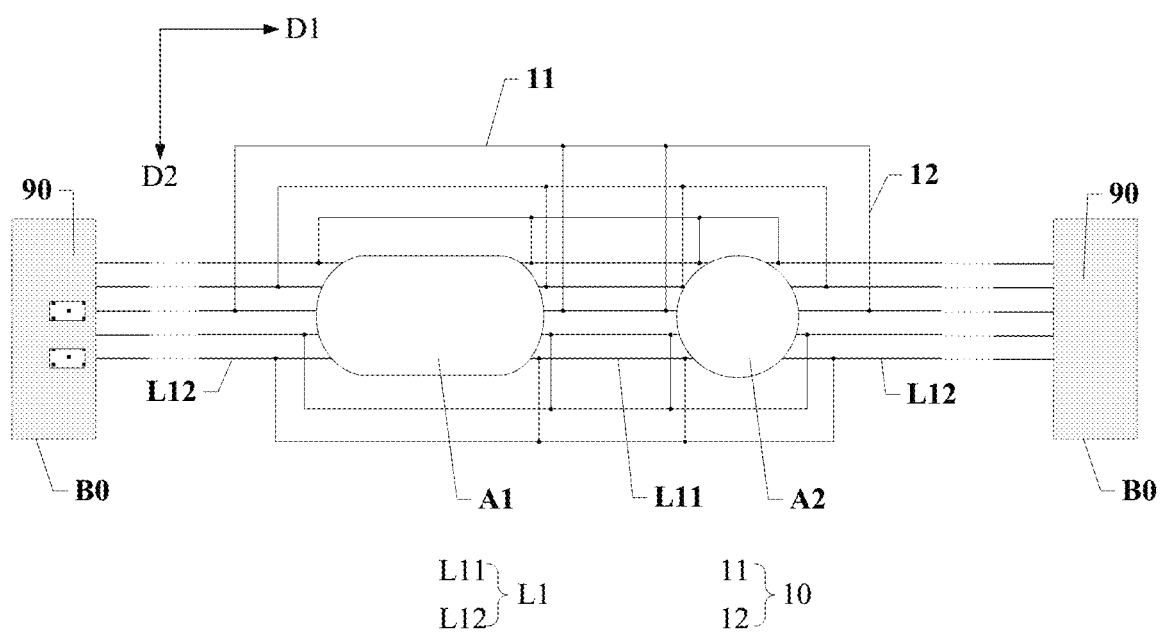
FIG. 8 illustrates an exemplary connection between the first signal lines and shift registers, consistent with various disclosed embodiments of the present disclosure.

FIG. 8 is a schematic diagram of a connection between the plurality of first signal lines L1 and the shift registers 90. Optionally, the frame region B0 of the display panel may be provided with a plurality of shift registers 90 for providing signals to the plurality of first signal lines L1. When the first line segments L11 located between the first optical component region A1 and the second optical component region A2 are respectively electrically connected to the second line segments L12 on both sides of the two optical component regions, only one of the two second line segments L12 connected to one first line segment L11 may be connected to one corresponding shift register 90 of the plurality of shift registers 90, and the signal provided by the shift register 90 may be transmitted to the first line segment L11 and another one of the two second line segments L12 through the second line segment L12 directly connected to it, and the signal transmission of different line segments on the same first signal line L1 may be realized. Therefore, the number of the plurality of shift registers 90 in the display panel may be reduced and the narrow frame design of the display panel may be realized.

Of course, in some other embodiments, when one first line segment L11 is respectively connected to the second line segments L12 on two sides of the first line segment L11 through one corresponding first connection line 10, the two second line segments L12 on two sides of the first line segment L11 may be both connected to the corresponding shift register, to realize the bilateral driving of the first signal line 10 and improve the driving ability of the first signal line 10 to the light-emitting elements in the display panel.

Figure 9:
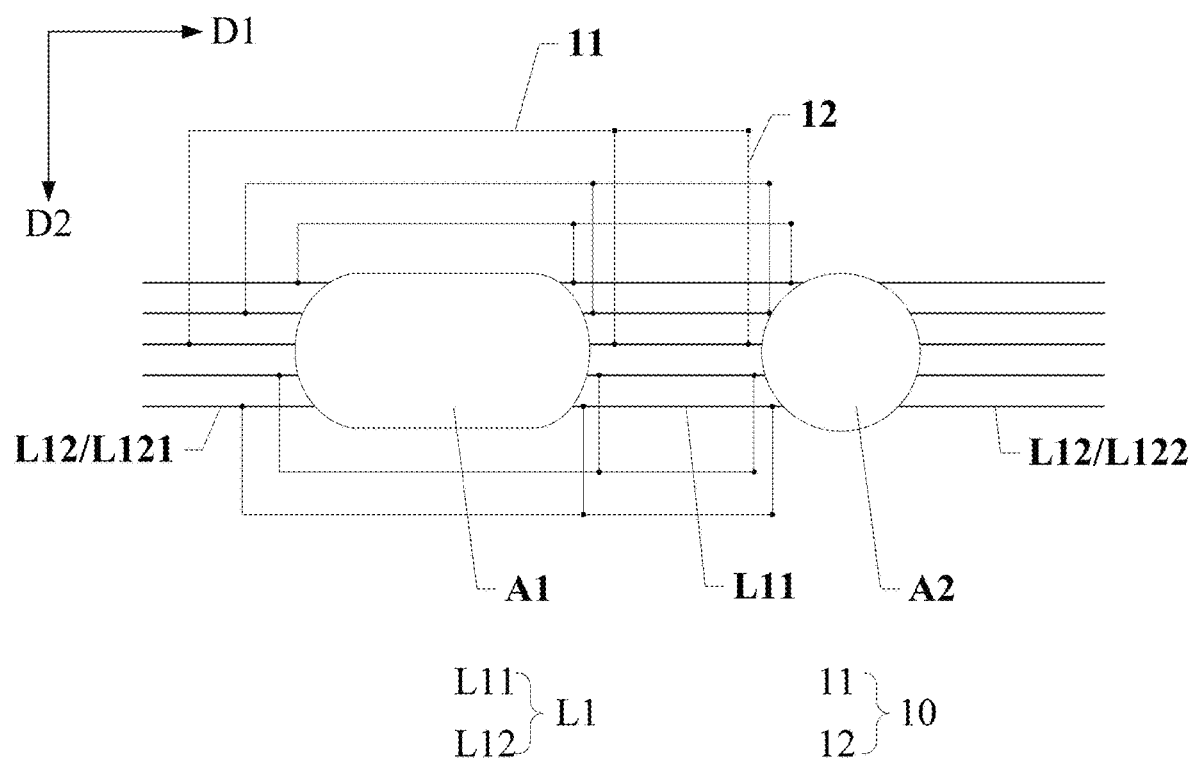
FIG. 9 illustrates another exemplary wiring schematic diagram of first signal lines around a first optical component region and a second optical component region, consistent with various disclosed embodiments of the present disclosure.
Figure 10:
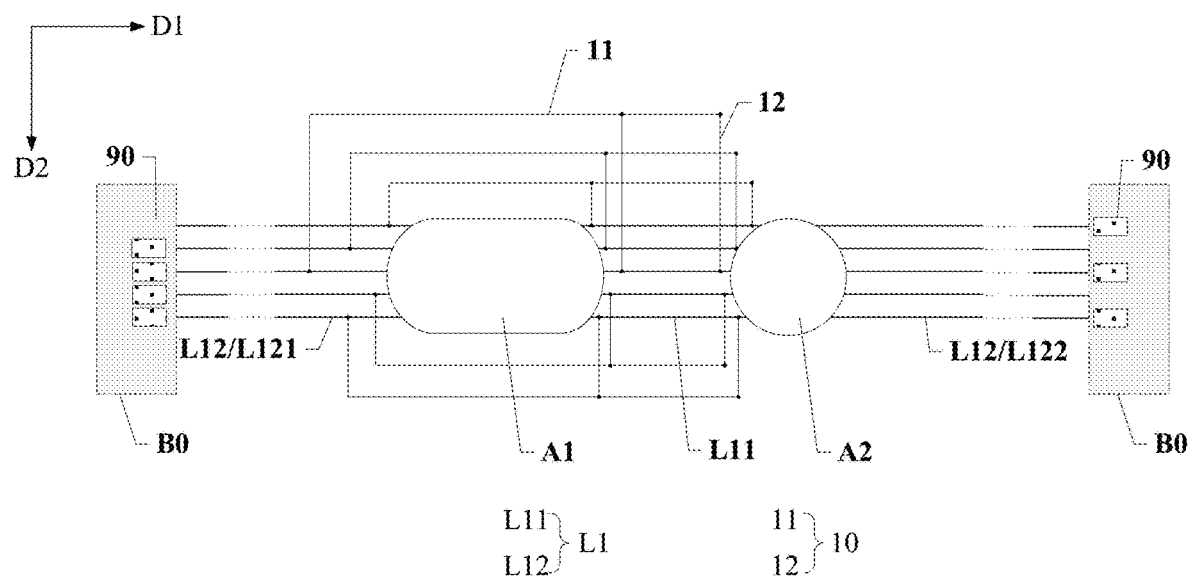
FIG. 10 illustrates another exemplary connection between the first signal lines and shift registers, consistent with various disclosed embodiments of the present disclosure.

FIG. 9 is another schematic diagram of wiring of the first signal lines L1 arranged around the first optical component region A1 and the second optical component region A2. FIG. 10 shows a connection diagram of the first signal lines 10 and the plurality of shift registers 90.

As shown in FIG. 9 and FIG. 10, in another embodiment of the present disclosure, one second line segment L12 may include a second line segment A L121 and a second line segment B L122. The second line segment A L121 may be located on a side of the first optical component region A1 away from the second optical component region A2, and the second line segment B L122 may be located on a side of the second optical component region A2 away from the first optical component region A1. The first line segment L11 may be only electrically connected to one of the second line segment A L121 and the second line segment B L122. The display panel may include a plurality of shift registers 90, and the second line segment A L121 and the second line segment B L122 may be respectively connected to different shift registers 90 of the plurality of shift registers 90.

Specifically, FIGS. 9 and 10 show that one first line segment L11 located between the first optical component region A1 and the second optical component region A2 may be only connected to one corresponding second line segment L12 on a side of the the first line segment L11 away from the first optical component region A1. In some other embodiment, the first line segment L11 may also only be electrically connected to one corresponding second line segment L12 on a side of the second optical component region A2 away from the first line segment L11. When the side of the first optical component region A1 away from the first line segment L11 and the side of the second optical component region A2 away from the first line segment L11 are respectively provided with the second line segment A L121 and the second line segment B L122, the first line segment L11 may be only electrically connected to the second line segment A L121, or only electrically connected to the second line segment B L122. The second segment A L121 and the second segment B L122 may be electrically connected to different shift registers 90, respectively. Taking FIG. 9 and FIG. 10 as an example, the signal of one shift register 90 connected to the second line segment A L121 may be transmitted to the first line segment L11 corresponding to the second line segment A L121 through the second line segment A L121, such that the region between the optical component region A1 and the second optical component region A2 is able to play a normal display function. The signal of another shift register 90 connected to the second line segment B L122 may be provided to the second line segment B L122, such that an region of the second optical component region A2 away from the first optical component region A1 is able to perform a normal display function. This arrangement, while ensuring the normal display function between the first optical component region A1 and the second optical component region A2, may also reduce the actual number of the plurality of first connection lines 10 and simplify the wiring complexity of the plurality of first connection lines 10.

Figure 11:
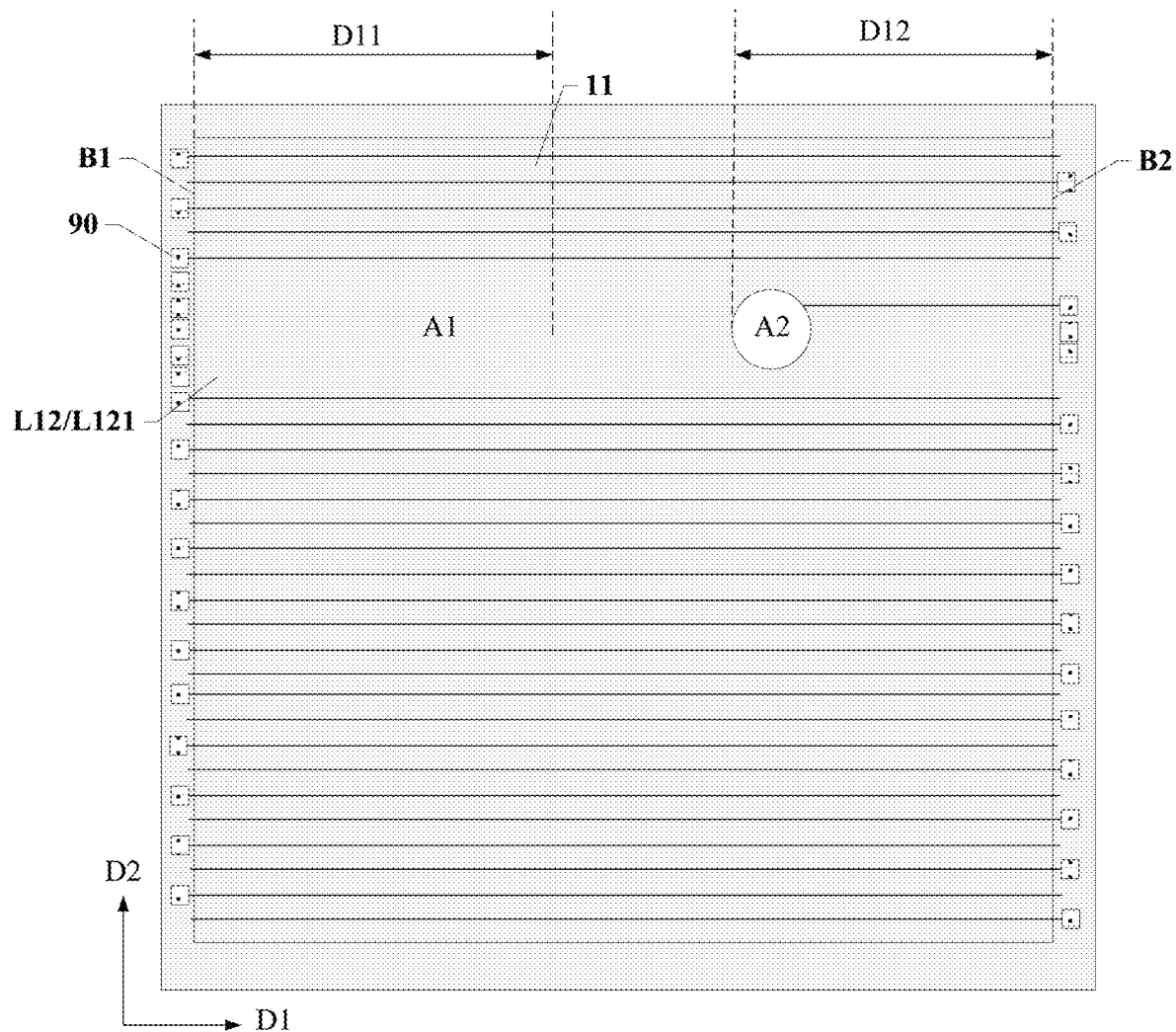
FIG. 11 illustrates another exemplary display panel consistent with various disclosed embodiments of the present disclosure.

FIG. 11 is another schematic structural view of the display panel. In another embodiment, as shown in FIG. 11, the first display region may include a first side B1 and a second side B2 opposite to each other along the first direction D1. The first side B1 may be located on the side of the first optical component region A1 away from the second optical component region A2, and the second side B2 may be located on the side of the second optical component region A2 away from the first optical component region A1. The distance between the first side B1 and an edge of the first optical component region A1 close to the second optical component region A2 may be D11, and the distance between the second side B2 and an edge of the second optical component region A2 close to the first optical component region A1 may be D12, where D11>D12. One first line segment L11 may be only electrically connected to one corresponding second line segment A L121.

Optionally, the width of the first optical component region A1 along the first direction D1 may be larger than the width of the second optical component region A2 along the first direction D1. When the distance D11 between the edge of first optical component region A1 close to the edge of the second optical component region A2 and the first side B1 is larger than the distance D12 between the edge of the second optical component region A2 close to the first optical component region A1 and the second side B2, one of the plurality of first signal lines L1 may have a large missing part at a position corresponding to the first optical component region A1. Therefore, when the first line segment L11 and the second line segment A L121 are electrically connected by the first connection line 10, the loading difference between the first line segment L11 and the second line segment A L121 and other first signal lines L1 may be reduced, to improve the accuracy and stability of signal transmission on the first signal lines L1.

Figure 12:
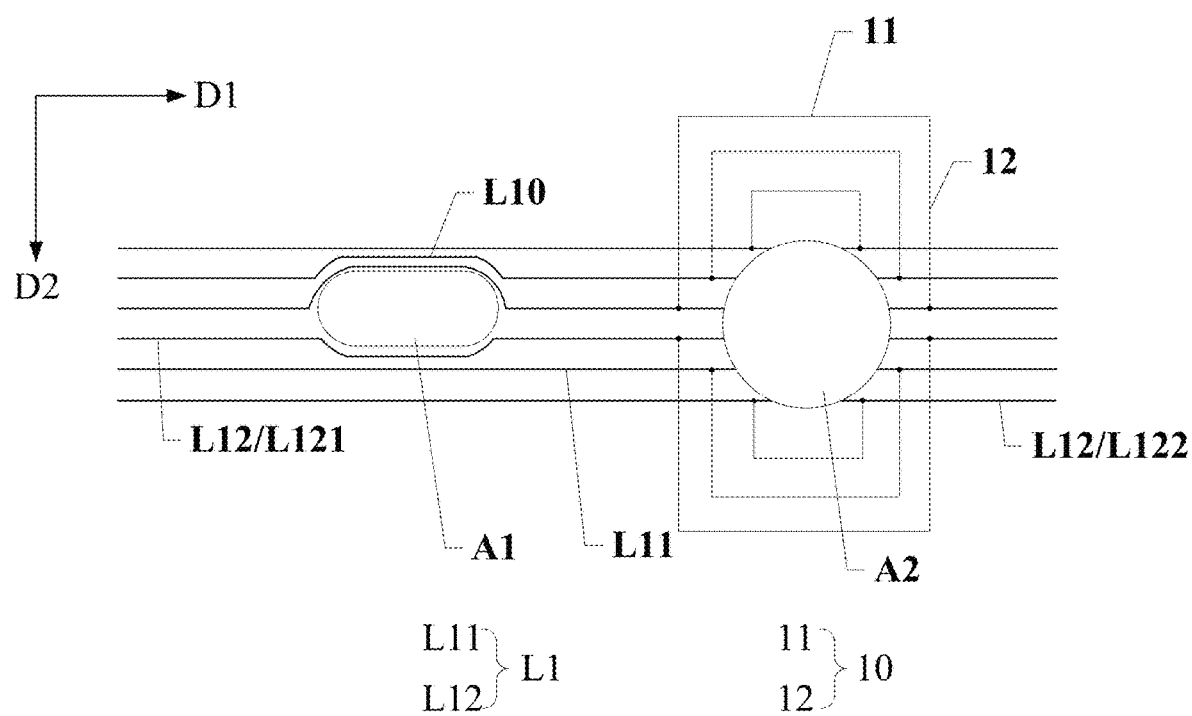
FIG. 12 illustrates another exemplary wiring schematic diagram of first signal lines around a first optical component region and a second optical component region, consistent with various disclosed embodiments of the present disclosure.

FIG. 12 is another schematic diagram of the wiring of the first signal lines L1 arranged around the first optical component region A1 and the second optical component region A2. In the embodiment shown in FIG. 12, a second end of one first line segment L11 may be electrically connected to another of the second line segment A L121 and the second line segment B L122 through a first connection line L10. The first connection line L10, the first line segment L11, the second line segment A L121 and the second line segment B L122 may be disposed in a same layer.

As shown in FIG. 12, in an optional embodiment, the second line segment L12 includes a second line segment A L121 and a second line segment A L122. The second line segment A L121 may be located on a side of the first optical component region A1 away from the second optical component region A2, and the second line segment B L122 may be located on a side of the second optical component region A2 away from the first optical component region A1.

A first end of the first line segment L11 may be electrically connected to one of the second line segment A L121 and the second line segment B L122, and a second end of the first line segment L11 may be electrically connected to the other of the second line segment A L121 and the second line segment B L122 through the first connection line L10. The first connection line L10, the first line segment L11, the second line segment A L121 and the second line segment B L122 may be disposed in a same layer.

In one embodiment shown in FIG. 12, when the width of the first optical component region A1 along the second direction D2 is smaller than the width of the second optical component region A2 along the second direction D2, the number of the first signal lines L1 overlapping the first optical component region A1 along the first direction D1 may be smaller than the number of the first signal lines L1 overlapping with the second optical component region A2. Therefore, the first ends of the first line segments L11 may be electrically connected to the second line segments A L121 through a small number of first connection lines L0. When the second ends of the first line segments L11 are electrically connected with the second line segments B L122 through the first connection lines 10, a large frame width around the second optical component region A2 induced by too many lines that are disposed in the second optical component region A2 may be avoided. Correspondingly, the number of first connection lines 10 introduced in the display panel may be reduced, to simplify the wiring difficulty of the first connection lines 10 and also to facilitate the realization of narrow frame around the first optical component region A1 and the second optical component region A1.

Figure 13:
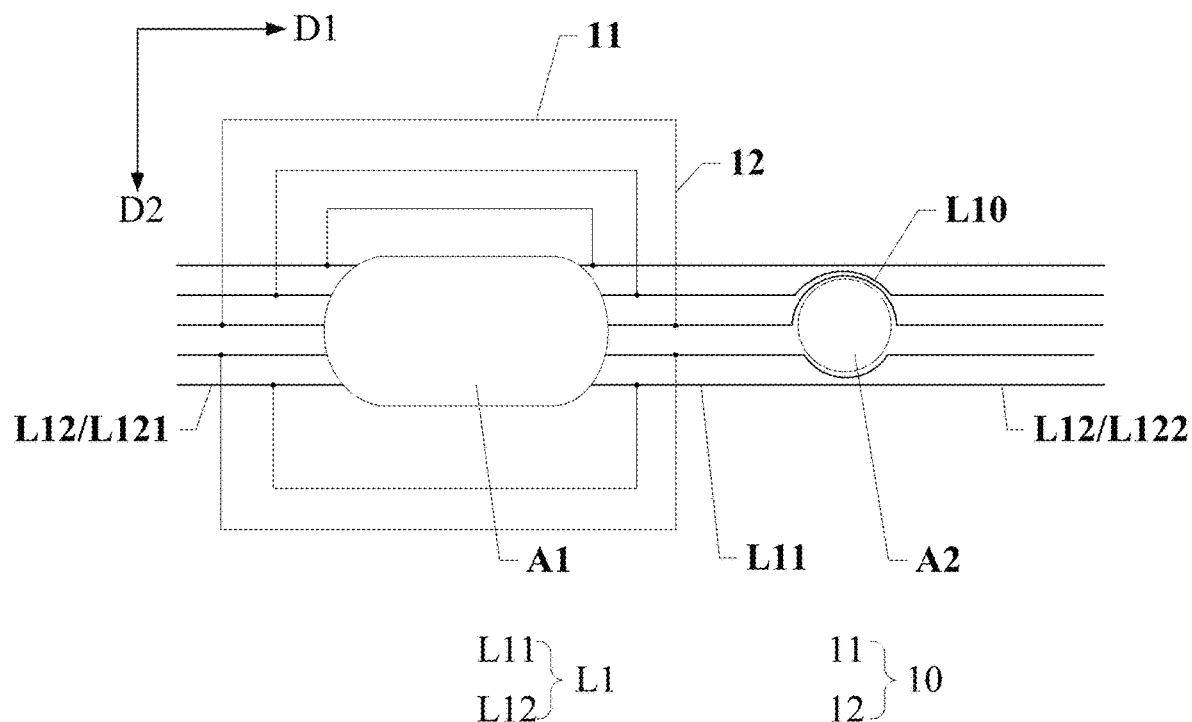
FIG. 13 illustrates another exemplary wiring schematic diagram of first signal lines around a first optical component region and a second optical component region, consistent with various disclosed embodiments of the present disclosure.

FIG. 13 is another schematic diagram of the wiring of the first signal lines L1 arranged around the first optical component region A1 and the second optical component region A2. In the embodiment shown in FIG. 13, one first line segment L11 may be electrically connected to one corresponding second line segment B L122 through one corresponding first connection line 10, and may be electrically connected to one corresponding second line segment A L121 through a corresponding first connection line L10.

As shown in FIG. 13, in an optional embodiment, along the second direction, the width of the first optical component region A1 along the second direction D2 may be larger than the width of the second optical component region A2 along the second direction D2. The second direction D2 may intersect the first direction. One first line segment L11 may be electrically connected to one corresponding second line segment B L122 through one corresponding first connection line 10, and may be electrically connected to one corresponding second line segment A L121 through a corresponding first connection line L10.

In one embodiment shown in FIG. 13, the width of the first optical component region A1 along the second direction D2 may be larger than the width of the second optical component region A2 along the second direction D2. Therefore, the number of the first signal lines L1 overlapping the first optical component region A1 along the first direction D1 may be larger than the number of the first signal lines L1 overlapping with the second optical component region A2. When the first line segment L11 is electrically connected to the corresponding second line segment B L122 and the corresponding second line segment A L121 through routed wirings, the number of the wirings in the first optical component region A1 may be too large, and the width of the frame around the first optical component region A2 may be also too large. In the present embodiment, one first line segment L11 may be electrically connected to one corresponding second line segment B L122 through one corresponding first connection line 10, and may be electrically connected to one corresponding second line segment A L121 through a corresponding first connection line L10. Since the first connection line 10 is arranged in different layers from the first line segment L11 and the second line segment L121, the first connection line 10 may no longer occupy the frame space around the first optical component region A1, which may be beneficial to realize narrowing the frame around the first optical component region A1. Since the number of first signal lines L1 overlapping with the second optical component region A2 along the second direction D2 is small, even when the electrical connection between the first line segment L11 and the second line segment B L122 is realized through the first connection line L10, the number of connection lines in the frame region around the second optical component region A2 may be still small and the problem of too large frame around the second optical component region A2 may not happen. Therefore, adopting the above design may be beneficial to realize the overall narrow frame design around the first optical component region A1 and the second optical component region A2 and increase the screen-to-body ratio of the display panel.

Figure 14:
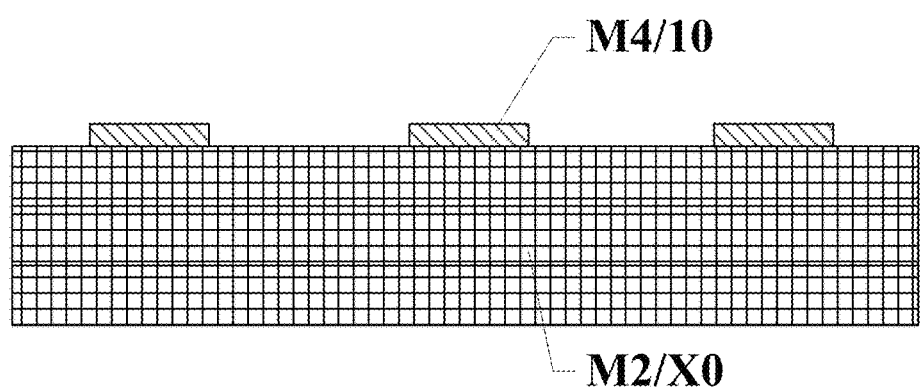
FIG. 14 illustrates a position relationship of a portion of segments in first connection lines and a fixed voltage signal line, consistent with various disclosed embodiments of the present disclosure.

FIG. 14 is a diagram showing a relative positional relationship between some line segments in the first connection line 10 and a fixed voltage signal line X0 in the display panel. The embodiment shown in FIG. 14 where the fixed voltage signal line X0 is located on the second metal layer M2 and at least part of the line segments in the first connection lines 10 are located on the fourth metal layer M4 is used as an example only for illustration, and does not limit the scope of the present disclosure. In various embodiments, the actual film layers of the fixed voltage signal line X0 and the first connection lines 10 are not limited. In some other embodiments, the first connection lines 10 may also be located in other film layers or be distributed in at least two different film layers, and the fixed voltage signal line X0 may also be located in other film layers. Further, FIG. 14 only schematically shows part of the film layer structure in the display panel, and does not represent all the film layer structures actually included in the display panel As shown in FIG. 14, in one embodiment, the display panel may further include a fixed voltage signal line X0. Along the thickness direction of the display panel, at least a portion of segments of the first connection lines 10 may overlap the fixed voltage signal line X0.

Figure 15:
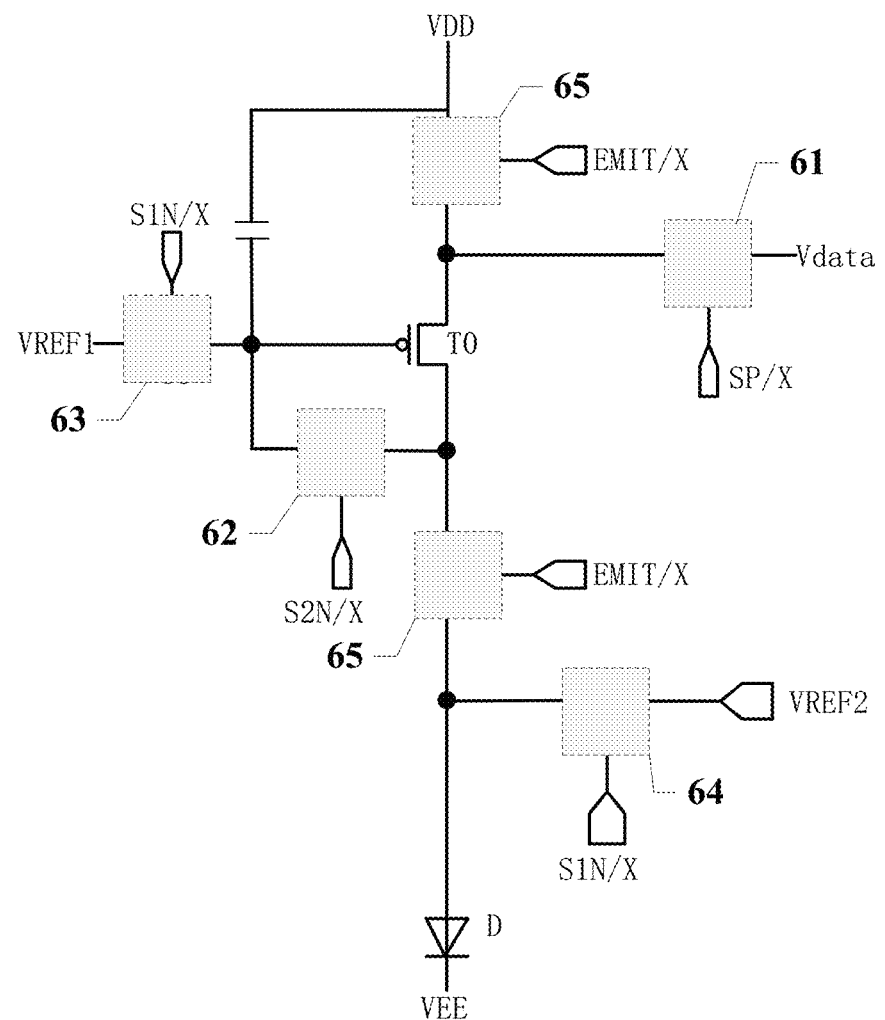
FIG. 15 illustrates an exemplary schematic diagram of a pixel circuit consistent with various disclosed embodiments of the present disclosure.

Optionally, the display panel may further include a plurality of pixel circuits. FIG. 15 is a schematic diagram of a pixel circuit. The embodiment shown in FIG. 15 is only used as an example to illustrate the present disclosure, and does not limit the actual pixel circuit structure. The pixel circuit may be used to drive a light emitting element D in the display panel to emit light. In one embodiment shown in FIG. 15, the pixel driving circuit may include a driving transistor TO and six switching transistors T1~T6. Except for the driving transistor TO, the other transistors may be all switching transistors. Gates of the switching transistors may be electrically connected with a control line X, to provide a driving signal to the switching transistors through the control line X and control the switching transistors to be turned on or off. Optionally, the control line X connected to the switching transistors may be wired on the display panel in a manner extending along the first direction D1. The plurality of first signal lines L1 mentioned in the embodiments may include control lines X. Optionally, the pixel circuit may include a data writing module 61, a compensation module 62, a first reset module 63, a second reset module 64, and a light emission control module 65. The control line X may include first control line S1N connected to control terminals of the first reset module 63 and the second reset module 64, a second control line S2N connected to a control terminal of the compensation module 62, a fourth control line SP connected to a control terminal of the data writing module 61, and a light emitting control line EMIT connected to the light emission control module 65. A signal line connected with the data writing module 61 may be a data line Vdata. A signal line connected with the first reset module 63 may be a first reset signal line VREF1, and a signal line connected with the second reset module 64 may be a second reset signal line VREF2. A signal line connected to the light emission control module 65 may be a first power signal line VDD, and a signal line connected to the light emitting element D may be a second power signal line VEE. Among them, the above-mentioned control lines connected with the pixel circuit may be used as signal lines for transmitting variable signals. The first reset signal line VREF1, the second reset signal line VREF2, the first power signal line VDD, and the second power signal line VEE may be used for transmitting fixed voltage signals, and may be fixed voltage signal lines. Since the signal on a fixed voltage signal line is constant, as shown in FIG. 14, when at least part of the line segments in the first connection lines 10 overlaps with the fixed voltage signal lines X0 along the thickness direction of the display panel, the signal on the fixed voltage signal line X0 may have less influence on the signal on the first connection lines 10. Further, at least part of the line segments in the first connection lines 10 introduced in the display panel may overlap the existing fixed voltage signal lines on the display panel. The mura problem of the display panel in the screen-off state may be also reduced.

Optionally, when one fixed voltage signal line X0 is embodied as a power signal line, for example, as a first power signal line VDD or a second power signal line VEE, the fixed voltage signal line X0 may include a line segment extending along the first direction D1 and a line segment extending along the second direction D2. At this time, along the thickness direction of the display panel, the first connection segment 11 of the first connection line 10 extending along the first direction D1 may be configured to overlap with one line segment of the fixed voltage signal line extending along the first direction D1, and the second connection segment 12 extending along the second direction D2 in the first connection line may be configured to overlap with other line segment extending along the second direction D2 of the fixed voltage signal line. The screen-off mura problem that may occur when the first connection lines 10 is introduced into the display panel may be further reduced. In some optional embodiments, along the thickness direction of the display panel, the first connection lines 10 may be arranged within a limited range of the fixed voltage signal lines.

Figure 16:
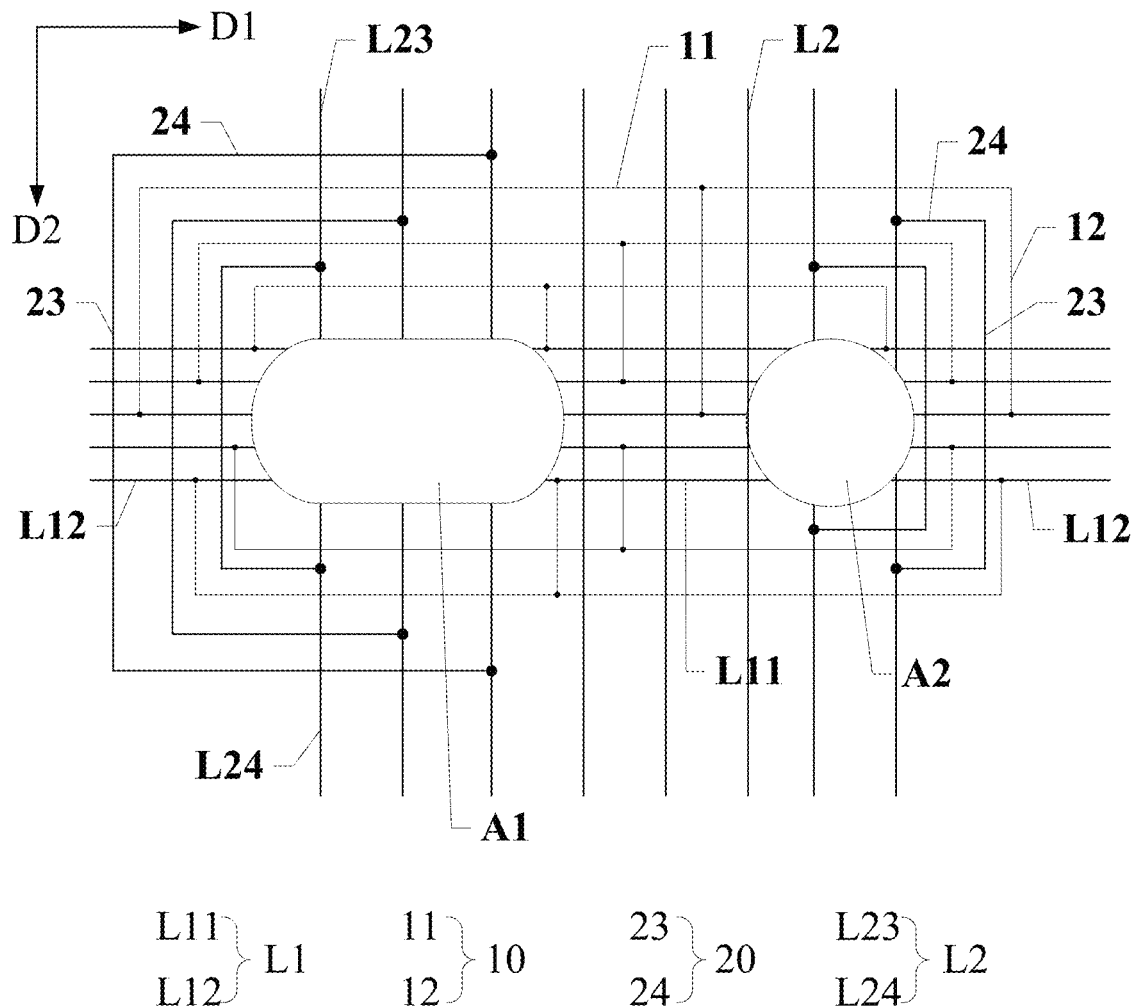
FIG. 16 illustrates another exemplary wiring schematic diagram of first signal lines and second signal lines around a first optical component region and a second optical component region, consistent with various disclosed embodiments of the present disclosure.

FIG. 16 is a schematic diagram of the wiring of the first signal lines L1 and the second signal lines L2 arranged around the first optical component region A1 and the second optical component region A2. As shown in FIG. 16, in one embodiment, the first display region may further include second signal lines L2 extending along the second direction D2, and the second direction D2 may intersect the first direction D1. One second signal line of a portion of the second signal lines L2 may include a third line segment L23 and a fourth line segment L24. The third line segment L23 may be located on the first side of the first optical component region A1 and the second optical component region A2 along the second direction D2, and the fourth line segment L24 may be located on the second side of the first optical component region A1 and the second optical component region A2 along the second direction D2. The third line segment L23 and the fourth line segment L24 may be connected by a corresponding second connection line 20, and at least part of the line segments of the second connection line 20 may be arranged in a different layer from the third line segment L23 and the fourth line segment L24.

Specifically, the embodiment shown in FIG. 16 shows a schematic wiring of the signal lines L2 in the first optical component region A1 and the second optical component region A2, when the second signal lines L2 extending along the second direction D2 overlap the first optical component region A1 or the second optical component region A2 along the second direction D2. One second signal line L2 overlapping with the first optical component region A1 or the second optical component region A2 along the second direction D2 may include the third line segment L23 and the fourth line segment L24 disposed on the upper and lower sides of the first optical component region A1 or the second optical component region A2, respectively. To realize the electrical connection between the third line segment L23 and the fourth line segment L24, a second connection line 20 may be introduced in this embodiment, and the third line segment L23 and the fourth line segment L24 may be connected by the second connection line 20. Since at least part of the line segments in the second connection line 20 are arranged in different layers from the third line segment L23 and the fourth line segment L24, when the second connection line 20 is used to connect the third line segment L23 and the fourth line segment L24, the second connection line 20 may not need to be routed around the first optical component region A1 or the second optical component region A2, thus facilitating the reduction of the routing provided in the frame around the first optical component region A1 and the second optical component region A2. Therefore, it may be beneficial to realize the narrow frame design around the first optical component region A1 and the second optical component region A2, and increase the screen ratio of the display panel.

As shown in FIG. 16, in another embodiment, one second connection line 20 may include a third connection segment 23 and a fourth connection segment 24. The third connection segment 23 may extend along the second direction D2 and the fourth connection segment 24 may extend along the first direction D1. The third line segments L23 and the fourth line segments L24 may be electrically connected through different fourth connection segments 24 and third connection segments 23 respectively.

When the second signal line L2 overlaps with the first optical component region A1 or the second optical component region A2 along the second direction D2, to realize the electrical connection between the third line segment L23 and the fourth line segment L24 in the second signal line L2, in this embodiment, one second connection line 20 may be introduced. Specifically, the second connection line 20 may include a third connection segment 23 extending along the second direction D2 and a fourth connection segment 24 extending along the first direction D1. When actually connecting, the third line segment L23 and the fourth line segment L24 to be connected may be respectively connected to different fourth connection segments 24, and then connected to the same third connection segment 23 through the fourth connection segments 24. Making the line segments of the second connection line 20 extend along the first direction D1 or along the second direction D2, may be compatible with the extending direction of the existing line segments in the first display region of the display panel. Therefore, by introducing the second connection line 20, the narrow frame design of the first optical component region A1 and the second optical component region A2 may be achieved and the wiring difficulty of the second connection lines 20 may be also simplified.

Optionally, when the second connection line 20 is introduced into the first display region, the second connection line 20 may be arranged to overlap with the fixed voltage signal line in the display panel along the thickness direction of the display panel. For example, the fourth line segment L24 extending along the first direction D1 in the second connection line 20 may overlap the line segment extending along the first direction D1 among the fixed voltage signal line, and the third line segment L23 extending along the second direction D2 in the second connection line 20 may overlap with the line segment extending along the second direction D2 in the fixed-voltage signal line. Since the signal in the fixed-voltage signal line is constant, when the second connection line 20 overlaps other signal lines, the jumping signals in other signal lines may be prevented from influence the signal transmitted by the second connection line 20, and also the screen-off mura phenomenon when the second connection line 20 is introduced into the display panel may be reduced. To further avoid the screen-off mura phenomenon, the second connection line 20 may also be arranged entirely within the range defined by the fixed voltage signal line along the thickness direction of the display panel.

As shown in FIG. 16, in an optional embodiment, at least part of the second connection line 20 may be located on the side of the first optical component region A1 away from the second optical component region A2, and at least part of the second connection line 20 may be located on the side of the second optical component region A2 away from the first optical component region A1.

When the first optical component region A1 and the second optical component region A2 are introduced into the display panel, the space between the first optical component region A1 and the second optical component region A2 may be small and need to play a display role. When the second connection line 20 is used to realizes the electrical connection between the third line segment L23 and the fourth line segment L24 in the second signal line L2, in this embodiment, among the third connection segment 23 extending along the second direction D2 in the second connection line 20, a portion of the third connection line section 23 may be arranged on the side of the first optical component region A1 away from the second optical component region A2, and another part of the third connection line section 23 may be arranged on the side of the second optical component region A2 away from the first optical component region A1, such that the second connection line 20 may not need to occupy a small space between the first optical component region A1 and the second optical component region A2. Therefore, reasonable wiring of the second connection segment L22 in the display panel may be realized, reducing the wiring complexity of the second connection lines 20.

Figure 17:
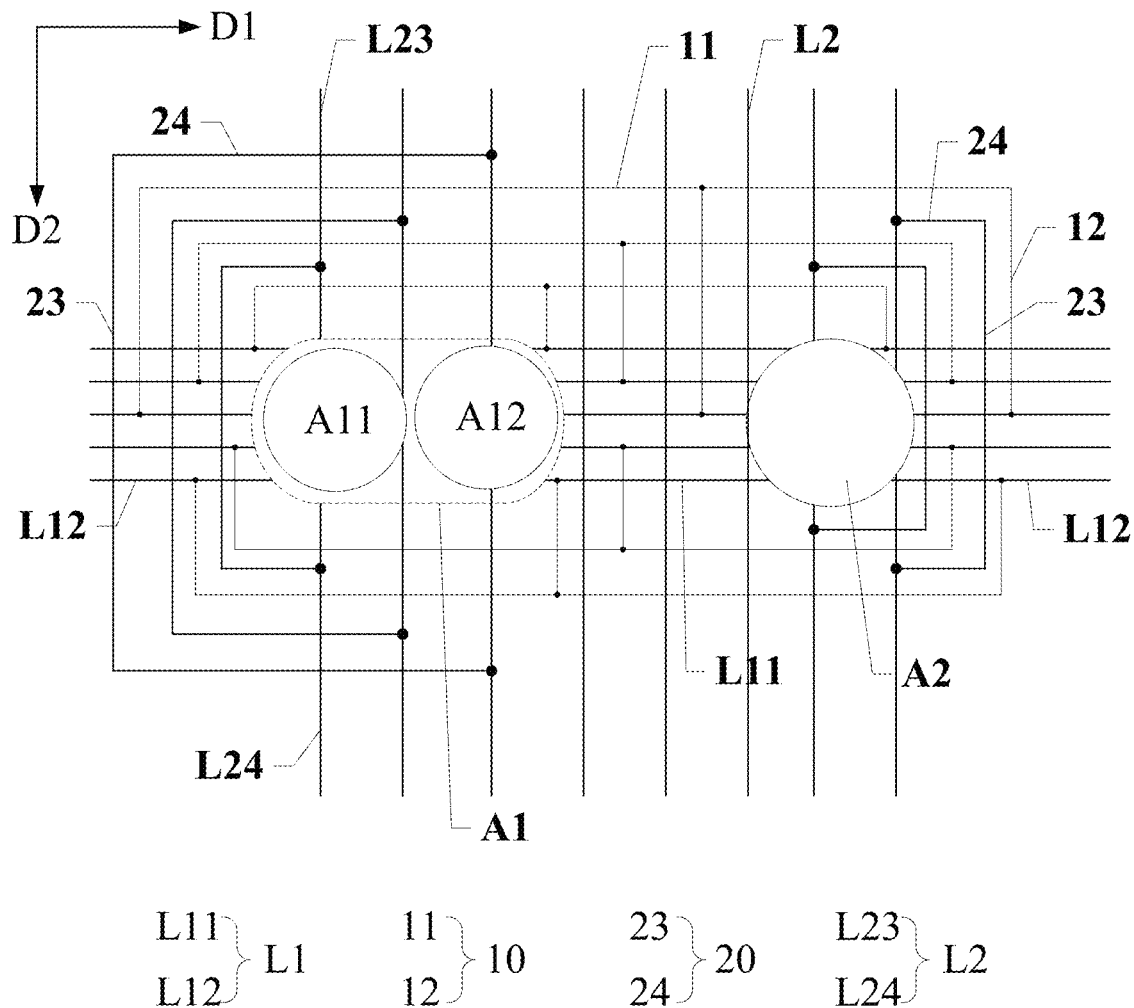
FIG. 17 illustrates another exemplary wiring schematic diagram of first signal lines and second signal lines around a first optical component region and a second optical component region, consistent with various disclosed embodiments of the present disclosure.
Figure 18:
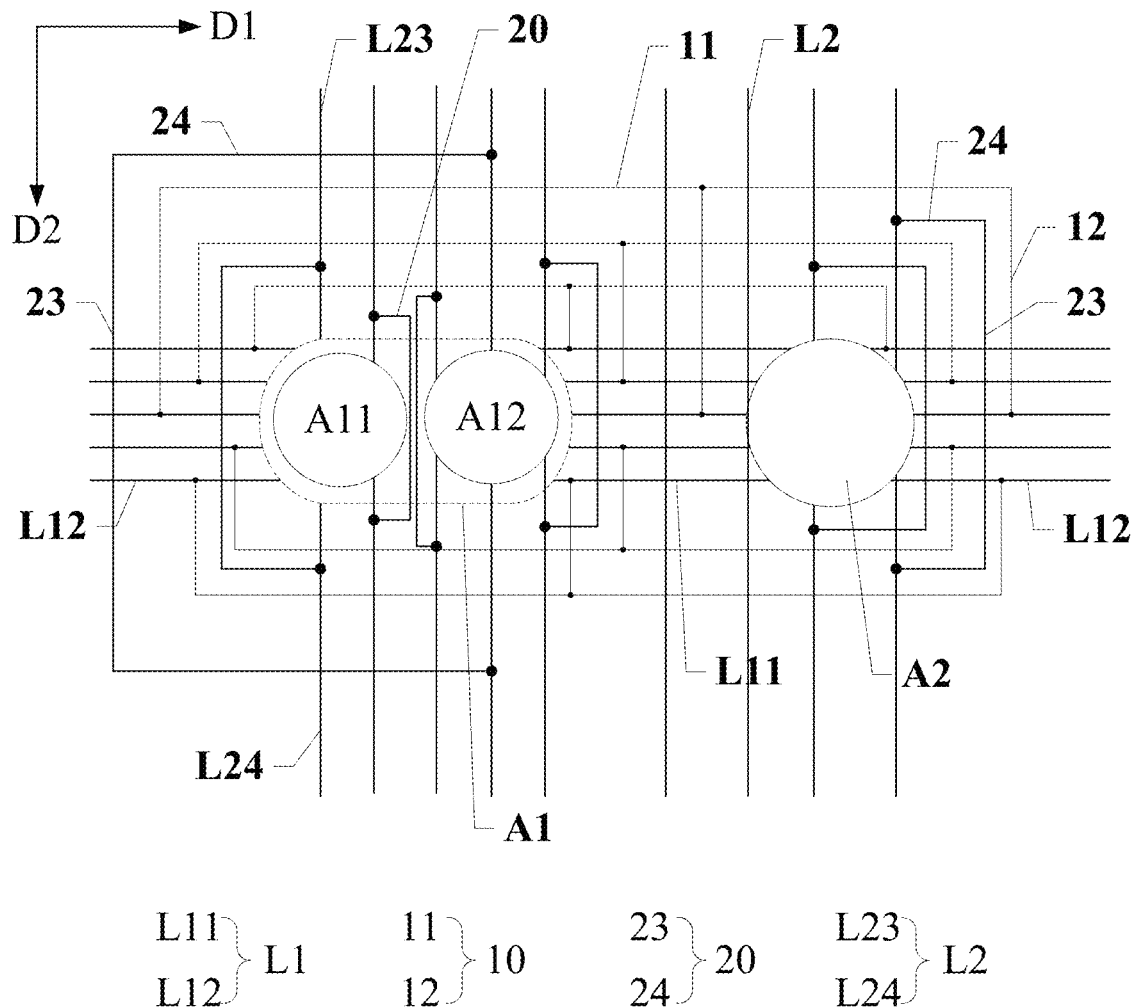
FIG. 18 illustrates another exemplary wiring schematic diagram of first signal lines and second signal lines around a first optical component region and a second optical component region, consistent with various disclosed embodiments of the present disclosure.

FIG. 17 and FIG. 18 respectively show another wiring diagram of the first signal line L1 and the second signal line L2 arranged around the first optical component region A1 and the second optical component region A2. The embodiments in FIG. 17 and FIG. 18 refine the specific structure of the first optical component region A1.

Optionally, the first optical component region A1 may include two sub-optical component regions. The two sub-optical component regions may be respectively the first sub-optical component region A11 and the second sub-optical component region A12 arranged along the first direction D1. Optionally, the first sub-optical component region A11, the second sub-optical component region A12 and the second optical component region A2 may be all circular. In other embodiments, the shapes of the first sub-optical component region A11, the second sub-optical component region A12 and the second optical component region A2 may be other suitable shapes. There may be a first interval between the first sub-optical component region A11 and the second sub-optical component region A12. In the embodiment shown in FIG. 17, the second connection line 20 may not be disposed between the first interval, to reduce the wiring density in the first interval.

As shown in FIG. 18, in another embodiment, the first optical component region A1 may include a first sub-optical component region A11 and a second sub-optical component region A12. The first sub-optical component region A11 and the second sub-optical component region A12 may be arranged along the first direction D1. There may be a first interval between the first sub-optical component region A11 and the second sub-optical component region A12. In the thickness direction of the display panel, at least part of the second connection line 20 may overlap the first interval.

Specifically, in the embodiment shown in FIG. 18, part of the second connection lines 20 may be arranged in the first interval between the first sub-optical component region A11 and the second sub-optical component region A12 in the first optical component region A1. The first space region may not play a display function. Therefore, when a part of the second connection line 20 is arranged in the first interval, without affecting the narrowing the frame of the first sub-optical component region A11 and the second sub-optical component region A12, the space of the first interval may be fully utilized.

Figure 19:
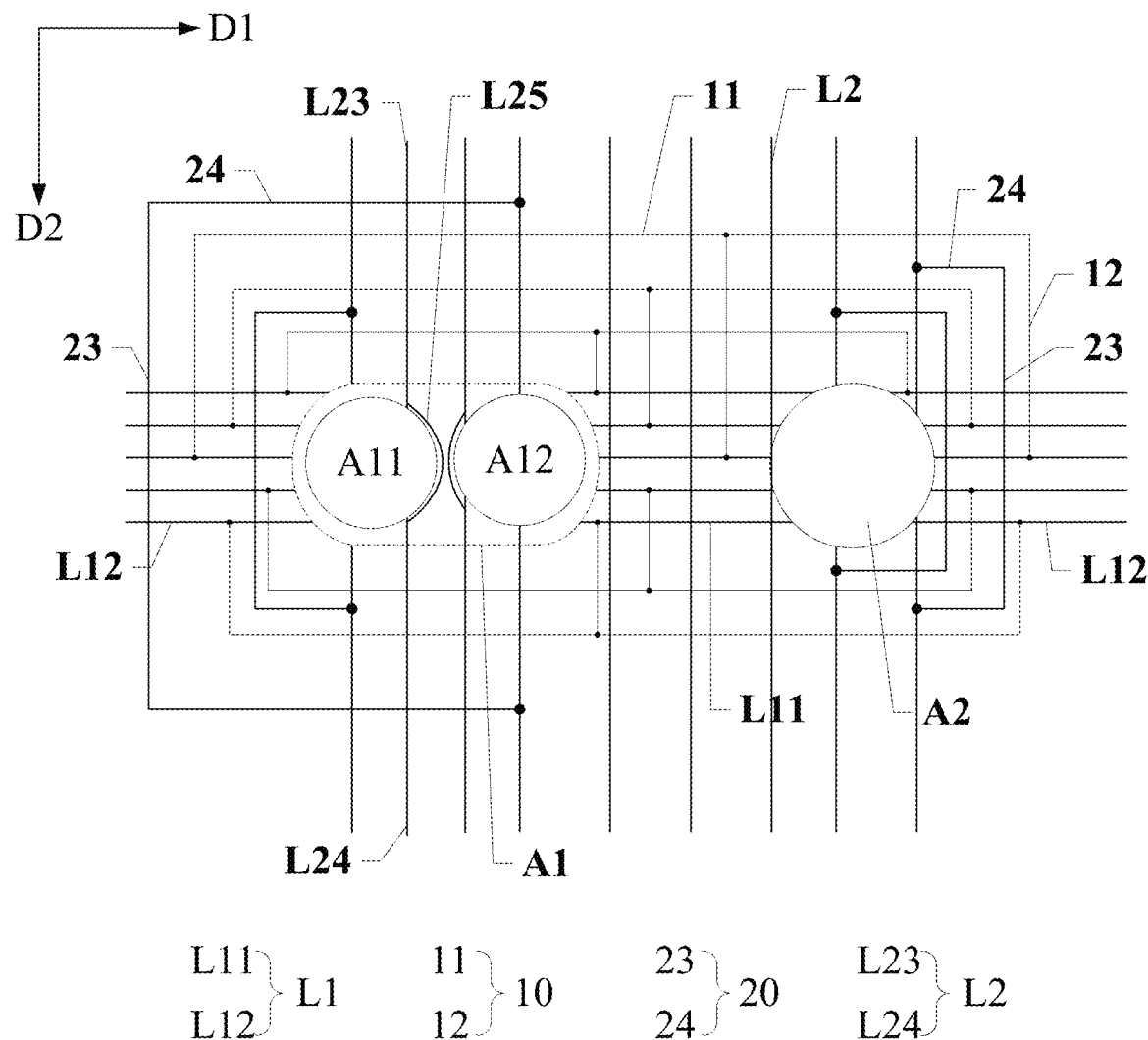
FIG. 19 illustrates another exemplary wiring schematic diagram of first signal lines and second signal lines around a first optical component region and a second optical component region, consistent with various disclosed embodiments of the present disclosure.

FIG. 19 is a schematic diagram showing another wiring of the first signal line L1 and the second signal line L2 arranged around the first optical component region A1 and the second optical component region A2. In one embodiment shown in FIG. 19, the first optical component region A1 may include a first sub-optical component region A11 and a second sub-optical component region A12. The first sub-optical component region A11 and the second sub-optical component region A12 may be arranged along the first direction D1, and there may be a first interval between the first sub-optical component region A11 and the second sub-optical component region A12. The display panel may also include a second connection line L25 located in the first interval. The second connection line L25, the third line segment L23 and the fourth line segment L24 may be arranged on the same layer, and at least part of the third line segment L23 and the fourth line segment L24 may be electrically connected through the second winding L25.

Figure 20:
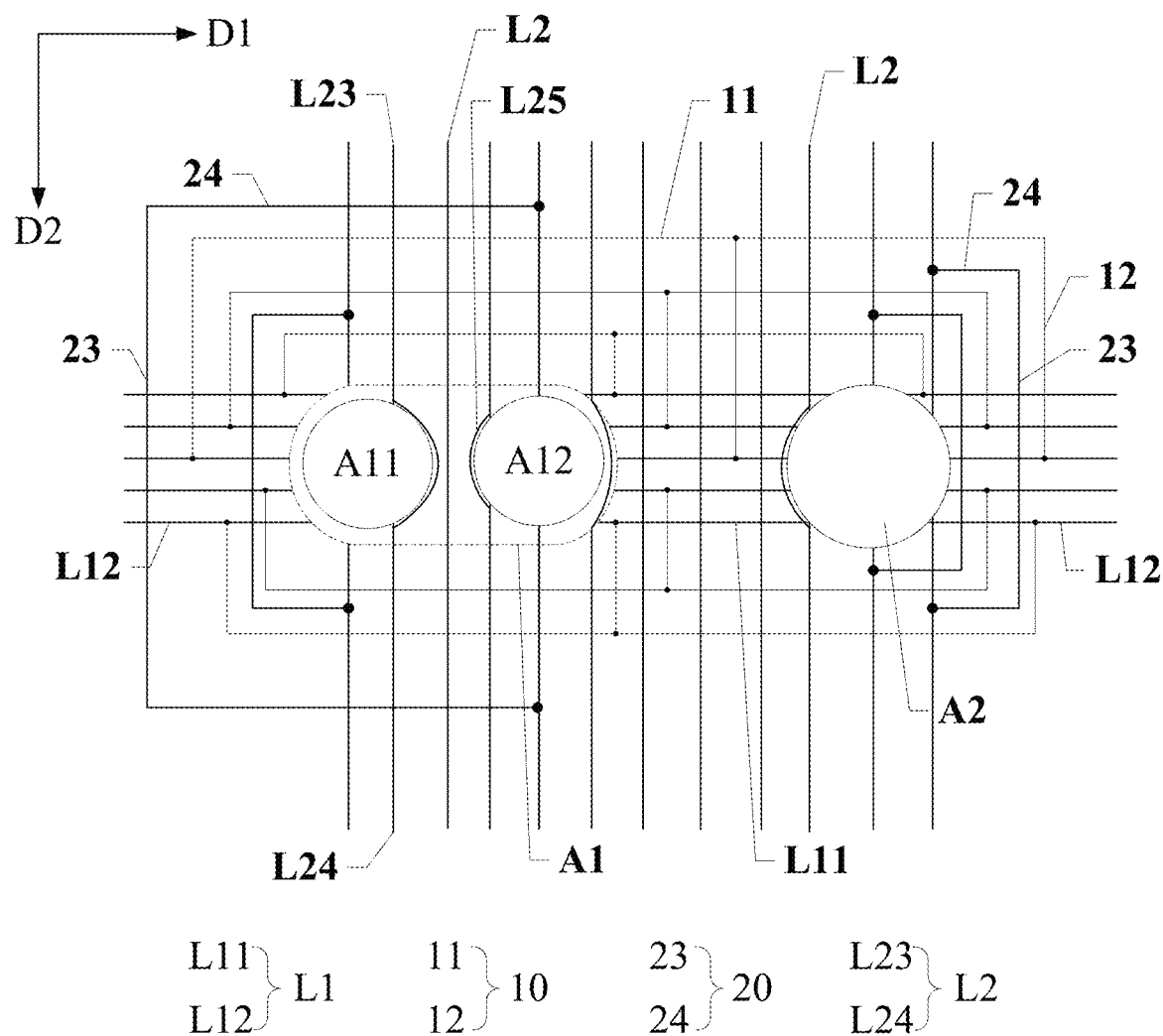
FIG. 20 illustrates another exemplary wiring schematic diagram of first signal lines and second signal lines around a first optical component region and a second optical component region, consistent with various disclosed embodiments of the present disclosure.

Specifically, when the first optical component region A1 includes the first sub-optical component region A11 and the second sub-optical component region A12 arranged along the first direction D1, the first interval between the first sub-optical component region A11 and the second sub-optical component region A12 may not need to perform a display function. When there are more second signal lines L2 overlapping with the first optical component region A1 along the second direction D2, the third line segments L23 and the fourth line segments L24 of the second signal lines L2 adjacent to the first interval may be electrically connected through the second connection line L25 in the first interval, making full use of the space of the first interval. There may be no need to occupy or occupy less frame space of the first sub-optical component region A11 and the second sub-optical component region A12, realizing a narrow frame design. Further, the second connection line L25 may be set on the same layer as the third line segment L23 and the fourth line segment L24. Therefore, there may be no need to introduce one second connection line 20 for this part of the third line segment L23 and the fourth line segment L24. The quantity of the second connection lines 20 introduced in the panel may be reduced, simplifies the wiring complexity of the second connection lines 20. Optionally, in another embodiment shown in FIG. 20, a part of the second signal line L2 in the display panel may directly pass through the first interval.

Figure 21:
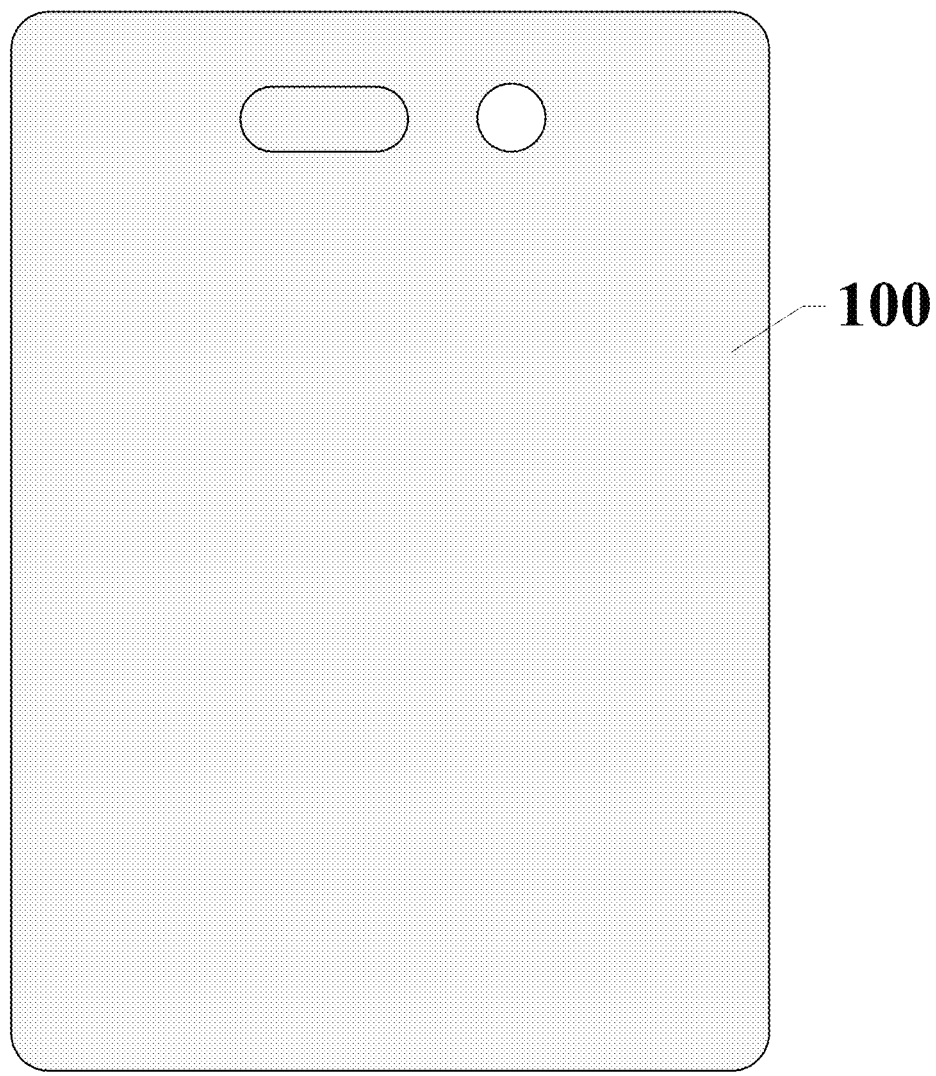
FIG. 21 illustrates an exemplary display device consistent with various disclosed embodiments of the present disclosure.

The present disclosure also provides a display device. As shown in FIG. 21, in one embodiment, the display device 200 may include any display panel 100 provided by various embodiments of the present disclosure.

In the present disclosure, the display device 200 may be any display device with display function, such as a computer, a cell phone, or a tablet. The display device provided by the present disclosure may have advantages same as the display panels provided by the present disclosure.

In the display panel and display device provided by various embodiments of the present disclosure, the first optical component region and the second optical component region may be arranged along the first direction. The first display region may at least partially surround the first optical component region and the second optical component region. The first display region may include a plurality of first signal lines extending along the first direction. Along the first direction, a part of the plurality of first signal lines may overlap the first optical component region and the second optical component region. Each of the part of the plurality of first signal lines may include the first line segment and the at least one second line segment. The first line segment may be located between the first optical component region and the second optical component region, and at least part of the second line segments may be located on the side of the first optical component region away from the second optical component region, and/or, at least part of the second line segment may be located on the side of the second optical component zone away from the first optical component zone. To realize the electrical connection between the first line segment and the second line segment in the first signal line, the first connection line may be disposed in the display panel. At least part of the line segments in the first connection line may be disposed in a layer different from the first line segment and the second line segment. When the first line segment and the second line segment are electrically connected through the first connection line, wiring in the frame region around the first optical component region or the second optical component region may be unnecessary. The number of wires corresponding to the frame region around the first optical component region and the second optical component region may be reduced, providing a compressible space for the frame region of the first optical component region and the second optical component region. Therefore, the narrow frame design around the optical component region corresponding to the first optical component region and the second optical component region may be achieved, to improve the screen ratio of the display panel and the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising a first display region, a first optical component region, and a second optical component region, wherein:
   the first optical component region and the second optical component region are arranged along a first direction;
   the first display region at least partially surrounds the first optical component region and the second optical component region;
   the first display region includes a plurality of first signal lines extending along the first direction;
   among at least part of the plurality of first signal lines, each first signal line includes a first line segment and a second line segment;
   the first line segment is located between the first optical component region and the second optical component region;
   the second line segment is located on a side of the first optical component region away from the second optic zone and/or a side of the second optical component region away from the first optical component region;
   the first line segment and the second line segment are electrically connected through a first connection line; and
   at least a portion of line segments of the first connection line is arranged in layers different from the first line segment and the second line segment.

2. The display panel according to claim 1, wherein:
   the first connection line includes a first connection segment and a second connection segment;
   the first connection segment extends along the first direction and the second connection segment extends along a second direction, wherein the first direction intersects with the second direction; and
   the first line segment and the second line segment are electrically connected through the second connection segment and the first connection segment.

3. The display panel according to claim 2, wherein:
   the first connection line includes one first connection segment and at least two second connection segments corresponding to the first connection segment; and
   the first line segment and the second line segment are respectively electrically connected with the same first connection segment through different second connection segments.

4. The display panel according to claim 3, wherein:
   a same first line segment is electrically connected to the first connection segment through at least two second connection segments.

5. The display panel according to claim 2, wherein:
   the first connection line includes a plurality of first connection segments and a plurality of the second connection segments;
   first line segments are respectively connected to first ends of different first connection segments through different second connection segments; and
   second ends of different first connection segments are electrically connected to different second line segments.

6. The display panel according to claim 2, wherein:
   some of the first connection segments are located at a first side of the first optical component region and the second optical component region along the second direction, and some of the first connection segments are located at a second side of the first optical component region and the second optical component zone along the second direction, wherein the first side and the second side are opposite.

7. The display panel according to claim 6, wherein:
   first connection segments corresponding to different first signal lines are disposed in a same layer, second connection segments corresponding to different first signal lines are disposed in a same layer, and the first connection segments and the second connection segments are disposed in different layers.

8. The display panel according to claim 1, wherein:
   the second line segment includes a second line segment A and a second line segment B;
   the second line segment A is located on the side of the first optical component region away from the second optical component region, and the second line segment B is located at the side of the second optical component region away from the first optical component region;
   the first line segment is only electrically connected to one of the second line segment A and the second line segment B;

the display panel further includes a plurality of shift registers; and the second line segment A and the second line segment B are respectively connected to different shift registers of the plurality of shift registers.

9. The display panel according to claim 8, wherein:

the first display region includes a first edge and a second edge opposite along a first direction;

the first edge is located on the side of the first optical component region away from the second optical component region, and the second edge is located on the side of the second optical component region away from the first optical component region;

a distance between the first edge and a side of the first optical component region close to the second optical component region is D11, and a distance between the second edge and a side of the second optical component region close to the first optical component region is D12, wherein, D11>D12; and the first line segment is only electrically connected with the second line segment A.

10. The display panel according to claim 1, wherein:

the second line segment includes a second line segment A and a second line segment B;

the second line segment A is located on the side of the first optical component region away from the second optical component region, and the second line segment B is located at the side of the second optical component region away from the first optical component region;

a first end of the first line segment is electrically connected to one of the second line segment A and the second line segment B through the first connection line, and a second end the first line segment is electrically connected to another one of the second line segment A and the second line segment B through a first winding line; and the first winding line and the first line segment are disposed in a same layer.

11. The display panel according to claim 10, wherein:

a width of the first optical component region is larger than a width of the second optical component region along a second direction, wherein the second direction intersects the first direction; and the first line segment is electrically connected to the second line segment A through the first connection line, and is electrically connected to the second line segment B through the first winding line.

12. The display panel according to claim 1, further comprising a fixed voltage signal line, wherein:

along a thickness direction of the display panel, at least a portion of line segments of the first connection line overlaps the fixed voltage signal line.

13. The display panel according to claim 1, wherein:

the first display region further includes second signal lines extending along a second direction, wherein the second direction intersects the first direction;

among some of the second signal lines, each second signal line includes a third line segment and a fourth line segment;

the third line segment is located at a first side of the first optical component zone and the second optical component zone along a second direction;

the fourth line segment is located at a second side of the first optical component zone and the second optical component zone along the second direction;

the third line segment and the fourth line segment are electrically connected by a second connection line; and at least a portion of line segments of the second connection line is disposed in a layer different from the third line segment and the fourth line segment.

14. The display panel according to claim 13, wherein:

the second connection line includes a third connection segment and a fourth connection segment;

the third connection segment extends along the second direction, and the fourth connection segment extends along the first direction; and the third line segment and the fourth line segment are electrically connected through different fourth connection segments and third connection segments.

15. The display panel according to claim 13, wherein:

at least a portion of the second connection line is located on the side of the first optical component region away from the second optical component region, and at least a portion of the second connection line is located on the side of the second optical component region away from the first optical component region.

16. The display panel according to claim 13, wherein:

the first optical component zone includes a first sub-optical component zone and a second sub-optical component zone;

the first sub-optical component zone and the second sub-optical component zone are arranged along the first direction;

there is a first interval between the first sub-optical component region and the second sub-optical component region; and in the thickness direction of the display panel, at least a portion of the second connection line overlaps the first interval.

17. The display panel according to claim 13, wherein:

the first optical component zone includes a first sub-optical component zone and a second sub-optical component zone;

the first sub-optical component zone and the second sub-optical component zone are arranged along the first direction;

there is a first interval between the first sub-optical component region and the second sub-optical component region;

the display panel further includes second winding lines in the first interval;

the second winding lines, the third line segments, and the fourth line segments are disposed in a same layer; and at least a portion of the third line segments and the fourth line segments are electrically connected through the second winding lines.

18. A display device comprising a display panel, wherein:

the display panel includes a first display region, a first optical component region and a second optical component region;

the first optical component region and the second optical component region are arranged along a first direction;

the first display region at least partially surrounds the first optical component region and the second optical component region;

the first display region includes a plurality of first signal lines extending along the first direction;

among at least part of the plurality of first signal lines, each first signal line includes a first line segment and a second line segment;

the first line segment is located between the first optical component region and the second optical component region;

the second line segment is located on a side of the first optical component region away from the second optic zone and/or a side of the second optical component region away from the first optical component region;

the first line segment and the second line segment are electrically connected through a first connection line; and at least a portion of line segments of the first connection line is arranged in layers different from the first line segment and the second line segment.

\* \* \* \* \*